(12) United States Patent  
Kajigaya

(10) Patent No.: US 7,965,575 B2  
(45) Date of Patent: Jun. 21, 2011

(54) SEMICONDUCTOR MEMORY DEVICE AND METHOD OF PROVIDING PRODUCT FAMILIES OF THE SAME

(75) Inventor: Kazuhiko Kajigaya, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 315 days.

(21) Appl. No.: 12/285,928

(22) Filed: Oct. 16, 2008

(65) Prior Publication Data

US 2009/0103389 A1  Apr. 23, 2009

(30) Foreign Application Priority Data

Oct. 19, 2007  (JP) ................................. 2007-272898

(51) Int. Cl.  
*G11C 8/00* (2006.01)

(52) U.S. Cl. .......... 365/230.03; 365/230.06; 365/189.05

(58) Field of Classification Search ............. 365/230.03, 365/230.06, 63, 189.05  
See application file for complete search history.

(56) References Cited

U.S. PATENT DOCUMENTS

| 6,888,733 | B2* | 5/2005 | Jang et al. ........................ 365/51 |
| 7,193,922 | B2* | 3/2007 | Miyo et al. ............... 365/230.03 |
| 2006/0117155 | A1 | 6/2006 | Ware et al. |
| 2008/0052573 | A1* | 2/2008 | Pekny ........................... 714/724 |

FOREIGN PATENT DOCUMENTS

| JP | 8-111088 | 4/1996 |
| JP | 2000-11641 | 1/2000 |
| JP | 2000-68441 | 3/2000 |
| JP | 2003-242800 | 8/2003 |

* cited by examiner

*Primary Examiner* — Connie C Yoha  
(74) *Attorney, Agent, or Firm* — McGinn IP Law, PLLC

(57) ABSTRACT

A semiconductor memory device includes a plurality of banks, a plurality of data input/output terminals, control signal terminals, address signal terminals, and at least one or a plurality of virtual chips, each of which has the banks grouped together, thereby being operable as one independent chip. Each of the data input/output terminals are allocated in dedicated manner to the one virtual chip or one of the plurality of virtual chips. The control signal terminals and the address signal terminals are shared among the one or the plurality of virtual chips.

20 Claims, 25 Drawing Sheets

| SIGNAL | SWITCH_0 | SWITCH_1 | SWITCH_2 | SWITCH_3 | SWITCH_4 | SWITCH_5 | SWITCH_6 | SWITCH_7 |
|---|---|---|---|---|---|---|---|---|
| A | /BA0(/CA0) | BA0(CA0) | /BA0(/CA0) | BA0(CA0) | /BA0(/CA0) | BA0(CA0) | /BA0(/CA0) | BA0(CA0) |
| B | /BA1(/CA1) | /BA1(/CA1) | BA1(CA1) | BA1(CA1) | /BA1(/CA1) | /BA1(/CA1) | BA1(CA1) | BA1(CA1) |
| C | /BA2(/CA2) | /BA2(/CA2) | /BA2(/CA2) | /BA2(/CA2) | BA2(CA2) | BA2(CA2) | BA2(CA2) | BA2(CA2) |

BA0 AND CA0, BA1 AND CA1, AND BA2 AND CA2 ARE SAME ADDRESS SIGNALS AND PROPERLY USED ACCORDING TO BIT CONFIGURATION (NUMBER OF VIRTUAL CHIPS)

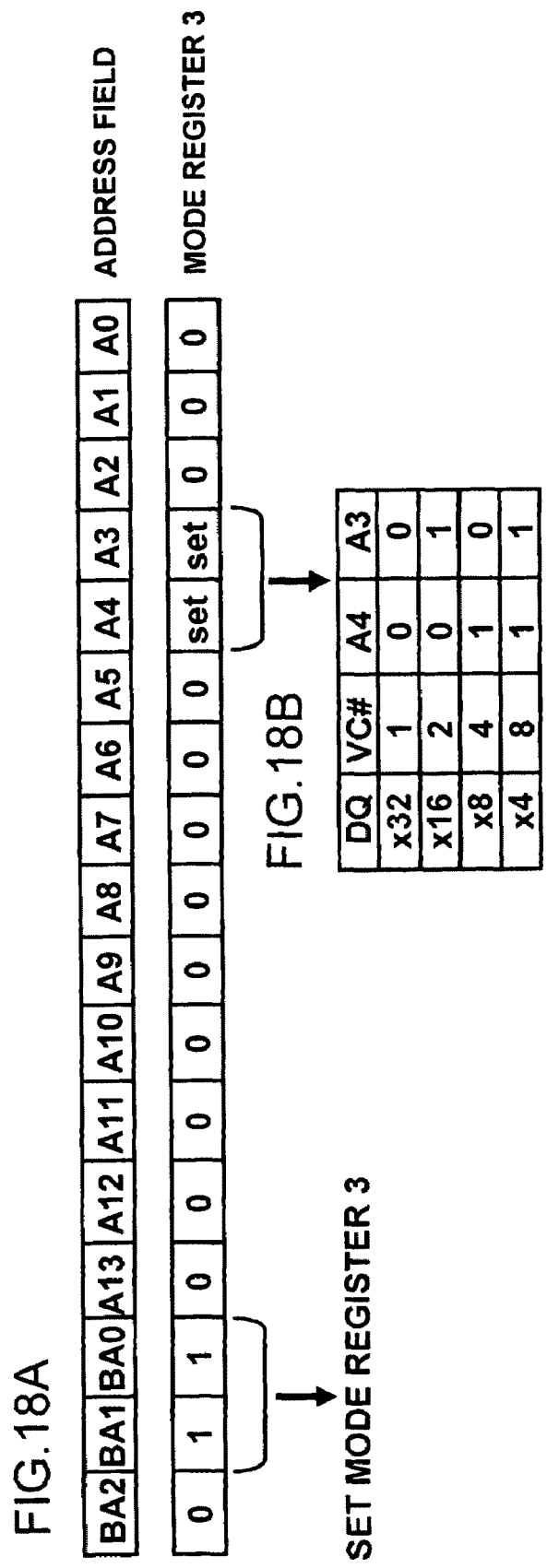

FIG.21 RELATED ART
8MWord x 32bit x8Bank
16MWord x 16bit x8Bank
32MWord x 8bit x8Bank
64MWord x 4bit x8Bank

SEMICONDUCTOR MEMORY DEVICE AND METHOD OF PROVIDING PRODUCT FAMILIES OF THE SAME

REFERENCE TO RELATED APPLICATION

This application is based upon and claims the benefit of the priority of Japanese patent application No. 2007-272898, filed on Oct. 19, 2007, the disclosure of which is incorporated herein in its entirety by reference thereto.

BACKGROUND OF THE INVENTION

1. Field of the Invention

The present invention relates to a semiconductor device. More specifically, the invention relates to a semiconductor memory device capable of providing a plurality of product families.

2. Description of Related Art

In recent years, due to the increase of a frequency of a clock signal driving a synchronous DRAM (SDRAM), the data transfer rate (bandwidth) of the synchronous DRAM has been remarkably improved. In an SDRAM compliant with the DDR3 (Double Data Rate3) specification, the maximum clock frequency has reached 800 MHz, and a data transfer rate per DQ pin has reached 1.6 Gbp/s. Accordingly, even in one chip where the number of DQ pins is 4 bytes=32 pins, a bandwidth of 6.4 GB/s may be obtained.

On the other hand, the improvement in an operation speed of a memory cell array arranged in a DRAM core is rather slow in comparison with the improvement in the operation clock frequency. In order to achieve a high data transfer rate, there is such a measure as to increase the number of bits to be read (prefetched) from the array simultaneously.

According to the DDR3 specification, prefetching of eight bits per DQ pin is performed, and the prefetched bits are subjected to parallel-to-serial conversion by a serializer and are consecutively output (burst read).

In case of writing, as well, data of eight bits per DQ pin is consecutively received (burst written), and the received data is subjected to serial-to-parallel conversion by a deserializer, and the parallel eight bits are simultaneously written to the memory array.

The eight-bit consecutive access (burst access) described above is executed by a one-time request for reading from the SDRAM or a one-time request for writing to the SDRAM.

For this reason, with the configuration having 32 DQ pins (which is an x32 configuration), a data amount to be read or written by one access becomes four bytes (=32 bits)×eight-bit burst access=32 bytes.

This is a large value, as an amount of one-time data transfer between a microprocessor and a main memory. A lot of applications need a data transfer amount which is smaller than this data transfer amount.

There has been used a microprocessor or a microcontroller which includes a plurality of CPU cores. Each core independently executes a different task. Thus, even if a data transfer amount for one core is not large, a large amount of data transfer is needed for an overall multi-core processor.

Further, there arises the need for performing data transfer to different regions on a main memory assigned to respective cores.

Such a request cannot be satisfied by specifications provided by a conventional DRAM.

[Patent Document 1]
JP Patent Kokai Publication No. JP-A-08-111088
[Patent Document 2]
JP Patent Kokai Publication No. JP-P2000-11641A
[Patent Document 3]
JP Patent Kokai Publication No. JP-P2000-68441A
[Patent Document 4]
JP Patent Kokai Publication No. JP-P2003-242800A
[Patent Document 5]
US2006/0117155A1

SUMMARY

The entire disclosures in the above-mentioned Patent Documents are incorporated herein by reference. The analysis below is given by the present invention.

In recent years, due to the improvement in the clock frequencies of the synchronous DRAM (termed also as SDRAM), the data rate (bandwidths) of the synchronous DRAM have been remarkably improved. In the SDRAM compliant with the DDR3 specification, the maximum clock frequency has reached 800 MHz, and the data transfer rate per DQ pin has reached 1.6 Gbp/s. Accordingly, even in the one chip where the number of DQ pins is 4 bytes=32 pins, the bandwidth of 6.4 GB/s may be obtained.

On the other hand, the improvement in the operation speed of a memory cell array in a DRAM core is slower than the improvement in the operation clock frequency. The number of bits to be read (prefetched) from the array simultaneously is increased, thereby accommodating the high data transfer rate. In the DDR3 specification, prefetching of eight bits per DQ pin is performed, and the prefetched bits are parallel-to-serial converted by the serializer, thereby being consecutively output (burst read). In case of writing as well, data of eight bits per DQ pin is consecutively received (burst written), and the received data is serial-to-parallel converted by the deserializer, and the eight bits are simultaneously written into the memory array.

The eight-bit consecutive access (burst access) described above is executed by a one-time request for reading from the SDRAM or a one-time request for writing into the SDRAM.

For this reason, in the configuration having the 32 DQ pins (which is the x32 configuration), the data amount to be read or written by one access becomes four bytes (=32 bits)×eight-bit burst access=32 bytes.

This is the large value as the amount of one-time data transfer between a microprocessor and a main memory. A lot of applications need the data transfer amount which is smaller than this data transfer amount.

In order to cope with such a problem, DRAM manufacturers have provided a product family in which the number of DQ pins is changed in a same chip or a product family in which the number of banks is changed in the same chip, using means such as:
wire bonding switching;
fuse blowing;
changing a mask in a wiring process; or
changing over a value in a mode register.
DRAM manufacturers supply products that meet customers' requests (refer to Patent Documents 1 through 4 described above, for example).

However, when the number of DQ pins of an SDRAM is decreased, a bandwidth of the SDRAM will be reduced as compared with a bandwidth of the SDRAM, the number of DQ pins thereof not being decreased, under the condition of the same clock frequency. Thus, there arises a problem that high-speed performance of the SDRAM cannot be fully utilized.

When four SDRAMS each having an x8 configuration are employed, for example, a bandwidth that is the same as the bandwidth of one SDRAM having the x32 configuration may be obtained. However, the SDRAMs will have a main memory capacity larger than necessary. Accordingly, there arise problems of an increase in the system cost, and an increase in the mount area.

FIGS. 20 through 25 are diagrams showing operation waveforms of an SDRAM compliant with the DDR3 specification in order to explain the problems described. In FIGS. 20 through 25, CLK denotes a clock, CMD denotes a command (of which A0 denotes a bank active command, R0 denotes a read command, W0 denotes a write command, and P0 denotes a precharge command). ADD denotes an address signal (of which rX0 denotes an X (row) address, and Y0 denotes a Y (column) address). For convenience of preparation of the drawings, 4DQ denotes four data terminals DQ. FIG. 20 shows read operations of an 8MWord×32 Bit×8Bank configuration, a 16MWord×16 Bit×8Bank configuration, a 32MWord×8 Bit×8Bank configuration, and a 64MWord×4 Bit×8Bank configuration. FIG. 21 is a partially expanded view showing a left half portion of FIG. 20, while FIG. 22 is a partially expanded view showing a right half portion of FIG. 20.

FIG. 23 shows write operations of the 8MWord×32 Bit× 8Bank configuration, 16MWord×16 Bit×8Bank configuration, 32MWord×8 Bit×8Bank configuration, and 64MWord×4 Bit×8Bank configuration. FIG. 24 is a partially expanded view showing a left half portion of FIG. 23, while FIG. 25 is a partially expanded view showing a right half portion of FIG. 23.

As seen from FIGS. 20 through 22 and FIGS. 23 through 25, when a bit width is halved according to a conventional product family provision method, a transfer rate as a chip is also halved.

When a data amount to be read by one access is 32 bytes, which is too large, in the x32 configuration, product families of an x16 configuration, the x8 configuration, and an x4 configuration may be used. However, the bandwidth may be reduced.

When the number of chips is increased to widen the bandwidth, the system will have a memory capacity larger than necessary. Accordingly, there arises the problems such an increase in the cost, an increase in the mounting area, and the like.

As one method for coping with the problems described above, an approach referred to as micro-threading is disclosed in Patent Document 5 (US2006/0117155A1). This approach, however, is the approach compliant with a standard referred to as the XDR-DRAM standard, which is different from standards for common general-purpose SDRAMs. For this reason, the approach described in Patent Document 5 cannot be applied to the SDRAMs that are extensively and generally used.

The present inventor has recognized that it is necessary to implement a semiconductor memory device that allow a total peak bandwidth to be maintained constant, even if a transfer amount of data to be accessed once on a same chip is changed.

The invention disclosed in this application is generally configured as follows.

In the present invention, there is provided a semiconductor memory device in which one chip is adapted to be virtually divided into one or a plurality of virtual chips, dedicated data pins are assigned to each of the one or the plurality of virtual chips, command and address pins are shared among the plurality of virtual chips, and commands and addresses are supplied to each of the one or the plurality of virtual chips by time division. Product family provision is performed so that the product of the number of the data pins in each virtual chip and the number of the virtual chips is made constant.

According to one aspect of the present invention, there is provided a semiconductor memory device including:

a plurality of banks each including a memory cell array with a plurality of memory cells arranged therein in a matrix form;

a plurality of data signal terminals that receive and/or output data signals;

a plurality of control signal terminals that receive control signals;

a plurality of address signal terminals that receive address signals; and one or a plurality of virtual chips, each having a predetermined number of the banks grouped together thereon and being operable as one independent chip, the data signal terminals being individually assigned to the one or the plurality of virtual chips, respectively, and the control signal terminals and the address signal terminals being shared among the plurality of virtual chips in a configuration of the plurality of virtual chips.

In one embodiment of the present invention, a plurality of product families may be made from the same semiconductor memory device, being associated with virtual chip configurations; and assuming that the number of the virtual chips in one product family is set to n, where n is a predetermined integer equal to or larger than one, and the number of the data signal terminals belonging to each of the virtual chips is set to m, where m is a predetermined integer equal to or larger than one, the plurality of product families are made so that the product of n and m is of a constant value in each of the plurality of product families.

In one embodiment of the present invention, both of the number n of the virtual chips and the number m of the data signal terminals belonging to each of the virtual chips are powers of two.

In one embodiment of the present invention, the address signals received at the address signal terminals include:

a bank address signal for specifying each of the banks; and a chip address signal for specifying each of the virtual chips; and the bank address signal and the chip address signal are set so that a signal which serves as the bank address signal in one product family serves as the chip address signal in another product family.

In one embodiment of the present invention, the control signals are respectively received through the control signal terminals by time division and the address signals are respectively received through the address signal terminals by time division.

In one embodiment of the present invention, the data signals are transferred from one of the data signal terminals in such a manner in which a predetermined number of the data signals are consecutively input or output responsive to input of one predetermined command from one of the control terminals.

In one embodiment of the present invention, periods where the predetermined number of the data signals are consecutively input or output are partially overlapped in timings among the different virtual chips.

In one embodiment of the present invention, each of the plurality of product families is made by at least one of:

(A) writing a predetermined value to a product family setting register provided in the semiconductor memory device, by a predetermined method;

(B) setting a bonding pad provided in the semiconductor storage device to a predetermined potential by bonding;

(c) blowing a fuse element provided in the semiconductor memory device by a predetermined method;

(D) connecting an anti-fuse element provided in the semiconductor memory device by a predetermined method; and (E) using one through a predetermined number of photomasks by switching, corresponding to each of the product families in a fabrication process of the semiconductor memory device.

There is provided a computer system including:
a multi-core processor including:
a plurality of processor cores; and
a control block that controls data transfer between the processor cores and an external memory device; and
the semiconductor memory device according the present invention;
wherein the semiconductor memory device is controlled by the control block.

In the present invention, there is provided a method of providing product families of a semiconductor memory device. Each of the product families is obtained by virtual division of a chip and having a predetermined number of banks grouped together thereon, thereby being operable as one independent chip. In this method, when making, from one product family configured to have one virtual chip with the maximum number of the banks and the maximum number of data pins, another product family configured to have a plurality of virtual chips with the different number of data pins, the number of data pins assigned to each of the virtual chips is reduced to be smaller than in the one product family and the data pins are assigned in a dedicated manner to each of the virtual chips; and the another product family is made so that the product of the number of the data pins in each of the virtual chips and the number of the virtual chips is constant. In the method according to the present invention, both of the number of the virtual chips and the number of the data pins belonging to each of the virtual chips are powers of 2.

In the present invention, there is provided a semiconductor device according to the present invention including a plurality of banks each including a memory cell array having a plurality of memory cells arranged therein in a matrix form. Data pins that receive or output data signals are assigned in a dedicated manner to each of one or a plurality of virtual chips. Each of the one or the plurality of virtual chips is obtained by virtual division of one chip and having a plurality of banks grouped together thereon, thereby being operable as one independent chip. In a configuration of the plurality of virtual chips, pins that receive command signals and address signals are shared among the plurality of virtual chips, and the command signals and the address signals are supplied to each of the plurality of virtual chips by time division.

In the semiconductor device according to the present invention, in a product family where the number of the banks is half the number of the banks in a virtual chip of one product family, the number of the virtual chips is set to double the number of the virtual chips in the one product family. In each of the virtual chips that are twice as many as the virtual chips in the one product family, the number of the dedicated data pins corresponding to each of the virtual chips is set to a half of the number of dedicated data pins in the one product family.

In one embodiment of the semiconductor device according the present invention, each of the one or the plurality of virtual chips includes: one or a plurality of the banks each of which receives a bank address, a row address, and a column address; and in the configuration of the plurality of virtual chips, each of the plurality of virtual chips comprises:
a selector which receives the bank address and also a chip address that selects one of the plurality of virtual chips; and
serial-to-parallel and parallel-to-serial conversion circuits that receive parallel data of a predetermined bit width from the selectors, converts the parallel data to serial data for output to the data pins, and converts serial data from the data pins to parallel data of the predetermined bit width and supplies the converted parallel data to the selector.

In one embodiment of the semiconductor device according to the present invention,
a configuration of each of the plurality of banks is changed according to the product family; and
in the product family where the number of the data pins in each virtual chip is set to a fraction of $2^n$ (in which n is a predetermined non-negative integer) of the data pins in the product family having a maximum number of the data pins in the virtual chip, each of the plurality of banks connects data input/output lines in the product family having the maximum number of the banks in the virtual chip to corresponding ones of the selectors at intervals of the fraction of $2^n$ of intervals of the product family having the maximum number of the banks in the virtual chip, using a product family selection signal, a highest-order column address of the product family having the maximum number of the data pins in the virtual chip, and higher-order consecutive n bits in the highest-order column address.

According to the present invention, even if a transfer amount of data to be accessed once on a same chip is changed, a total peak bandwidth can be maintained constant.

According to the present invention, a memory, of which usability is improved while maintaining compatibility with a common standard, can be provided.

According to the present invention, a memory in which memory buses can be assigned corresponding to a plurality of processor cores, respectively, can be provided.

Still other features and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIGS. 18A and 18B are a diagram and a table showing an example of setting of a mode register;

FIG. 21 is a partially expanded view showing a left half portion of FIG. 20;

DETAILED DESCRIPTION OF THE PREFERRED EMBODIMENTS

Figure 1:
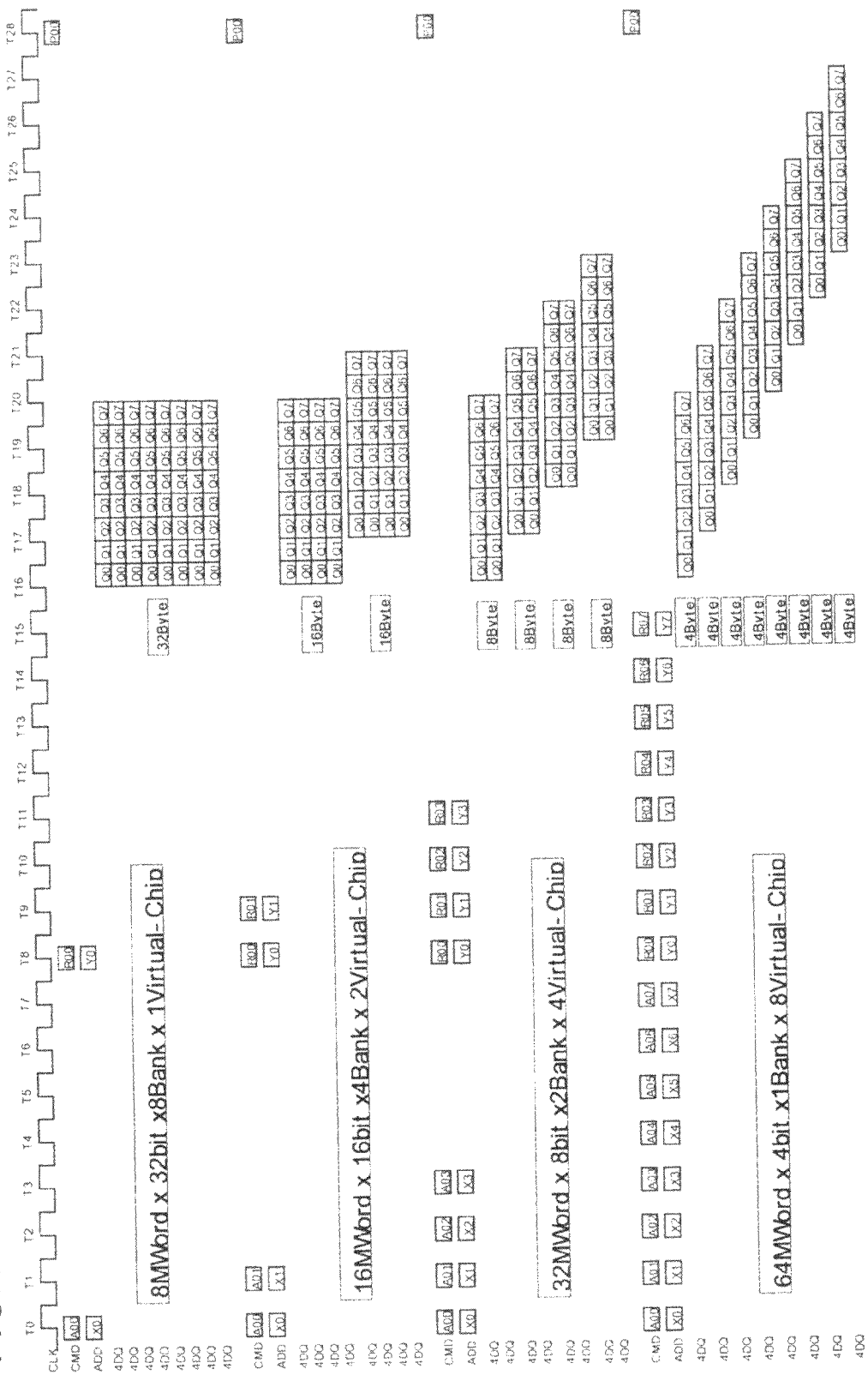
FIG. 1 is a timing diagram showing provision of bit configurations and (reading) operation waveforms in an embodiment of the present invention.

In order to describe the present invention described above in further detail, an embodiment of the present invention will be described below with reference to appended drawings.

First, the principle of the present invention will be described. In a semiconductor memory device according to the present invention, when provision of product families having different numbers of data input/output pins (DQ pins) is performed from a same chip, the chip is virtually divided into a plurality of virtual chips in parallel with reduction of the number of the DQ pins. Then, dedicated DQ pins are assigned to each virtual chip. A memory, in which the product of the number of the DQ pins in each virtual chip and the number of the virtual chips is constant, is provided. For example, a same chip is divided into n=$2^p$ (where p is 0, 1, 2, . . . or the like) virtual chips, and the product of a number m of data signal terminals in each virtual chip and a number n of the virtual chips is made constant.

In the semiconductor memory device according to the present invention, a clock, commands, and address pins are shared by the respective virtual chips. A command signal (indicating a command) and an address signal are supplied to the respective virtual chips, by time division, for example.

As a result, each virtual chip may be operated like an independent chip, in the semiconductor memory device according to the present invention.

For this reason, while reducing a data transfer amount in each virtual chip, a total peak bandwidth as the chip may be maintained.

Absolute amounts of information flowing though respective buses corresponding to each of the commands and the address pins are smaller than that of a DQ pin. Thus, even if each virtual chip uses the command and the address pin by time division, total performance will not be limited.

The product family provision described above is performed by one of approaches listed below:
wire bonding switching
fuse blowing
mask switching in a wiring process
switching of a mode register set value When the mode register set value switching in particular is employed, a DQ configuration and the number of the virtual chips can be set in a stage where the system is started.

By setting a unit of division used for obtaining the virtual chips to an integer times of a minimum unit of a memory array bank, selection of the virtual chip may be made by using a bank address without alteration. Thus, there is no need for changing an SDRAM pin configuration.

When product family provision that changes a bit width is performed in a configuration of a related art, only a chip bandwidth is changed. According to the present invention, however, as described above, data exchange with a plurality of access sources (such as a processor, a DRAM controller, and the like) can be made while maintaining a total bandwidth at its maximum value.

Further, with respect to bank switching, switching the number of banks and the number of I/Os are independent in the related art. On contrast therewith, in the present invention, the number of the banks, the number of the virtual chips, and the number of I/Os are associated with one another. When the number of the banks is halved, for example, the number of the virtual chips doubles, and the number of I/Os corresponding to the virtual chips is halved (which means that the total number of I/Os in the chip remains unchanged).

Generally, even if a plurality of banks are present, the respective banks share I/Os. Accordingly, when accesses are made to different banks, it is necessary that there is no contention in the I/Os.

Dedicated I/Os are assigned to the virtual chip. Thus, even if the I/O contention occurs, no problem will arise. A description will be given below in connection with the exemplary embodiments.

Figure 4:
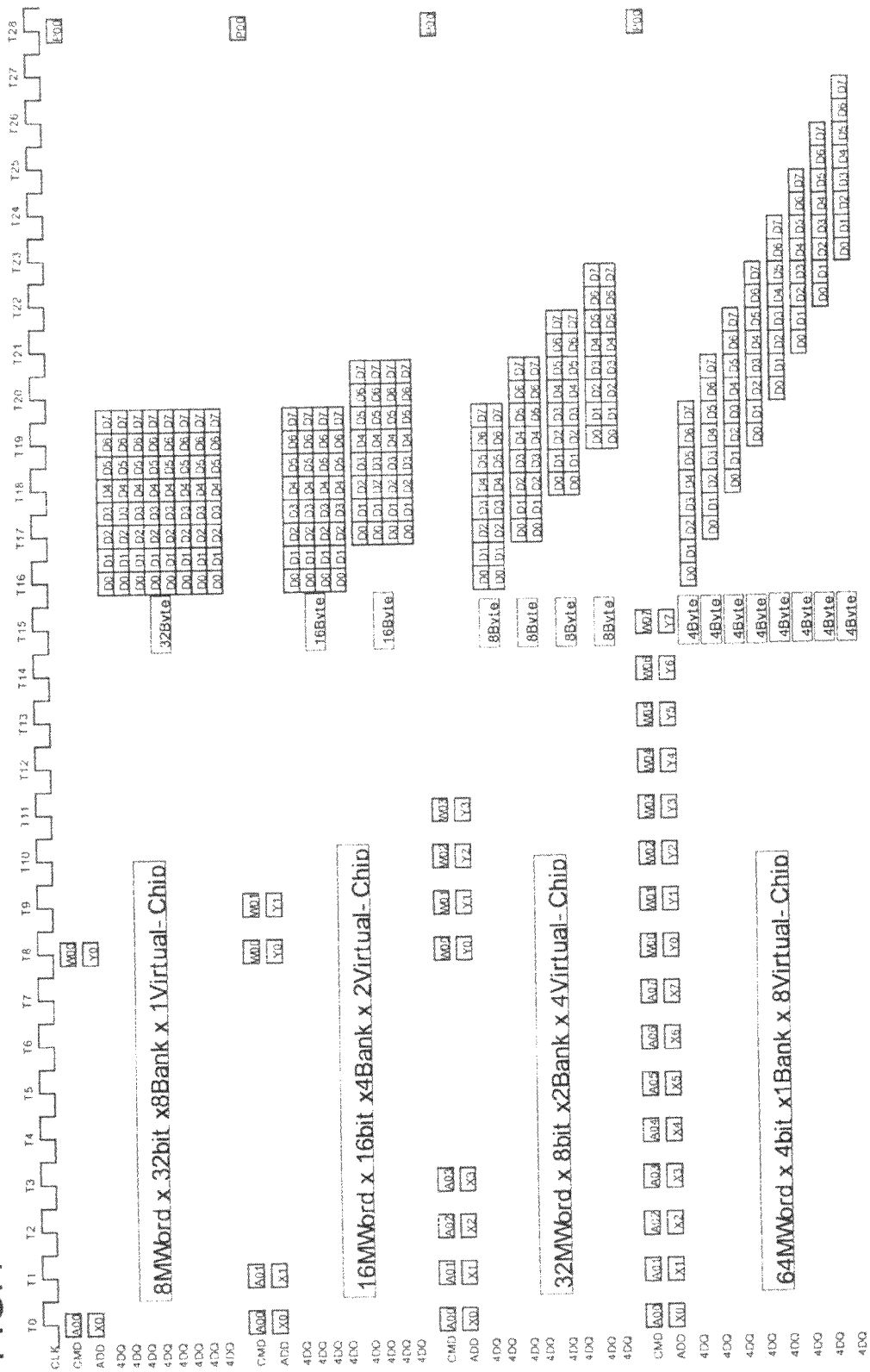
FIG. 4 is a timing diagram showing the provision of the bit configurations and (writing) operation waveforms in the embodiment of the present invention.

FIGS. 1 and 4 are timing diagrams for explaining read operations and write operations in the exemplary embodiment of the present invention. FIG. 1 shows examples of product family provision of DRAM bit configurations of the present invention and an input/output waveform in each configuration when reading is performed.

A chip as a whole has a memory capacity of 2 Gbits, and is so designed as to allow provision of four product families composed of one virtual chip (with an 8MWord×32 Bit× 8Bank configuration), two virtual chips (each with a 16MWord×16 Bit×4Bank configuration), four virtual chips (each with a 32MWord×8 Bit×2 Bank configuration), and eight virtual chips (each with a 64MWord×4 Bit×1Bank configuration), respectively. The configuration of the one virtual chip has completely the same configuration as a common DDR3-SDRAM with the 8MWord×32 Bit×8Bank configuration and can perform same operations as the common DDR3-SDRAM.

Figure 2:
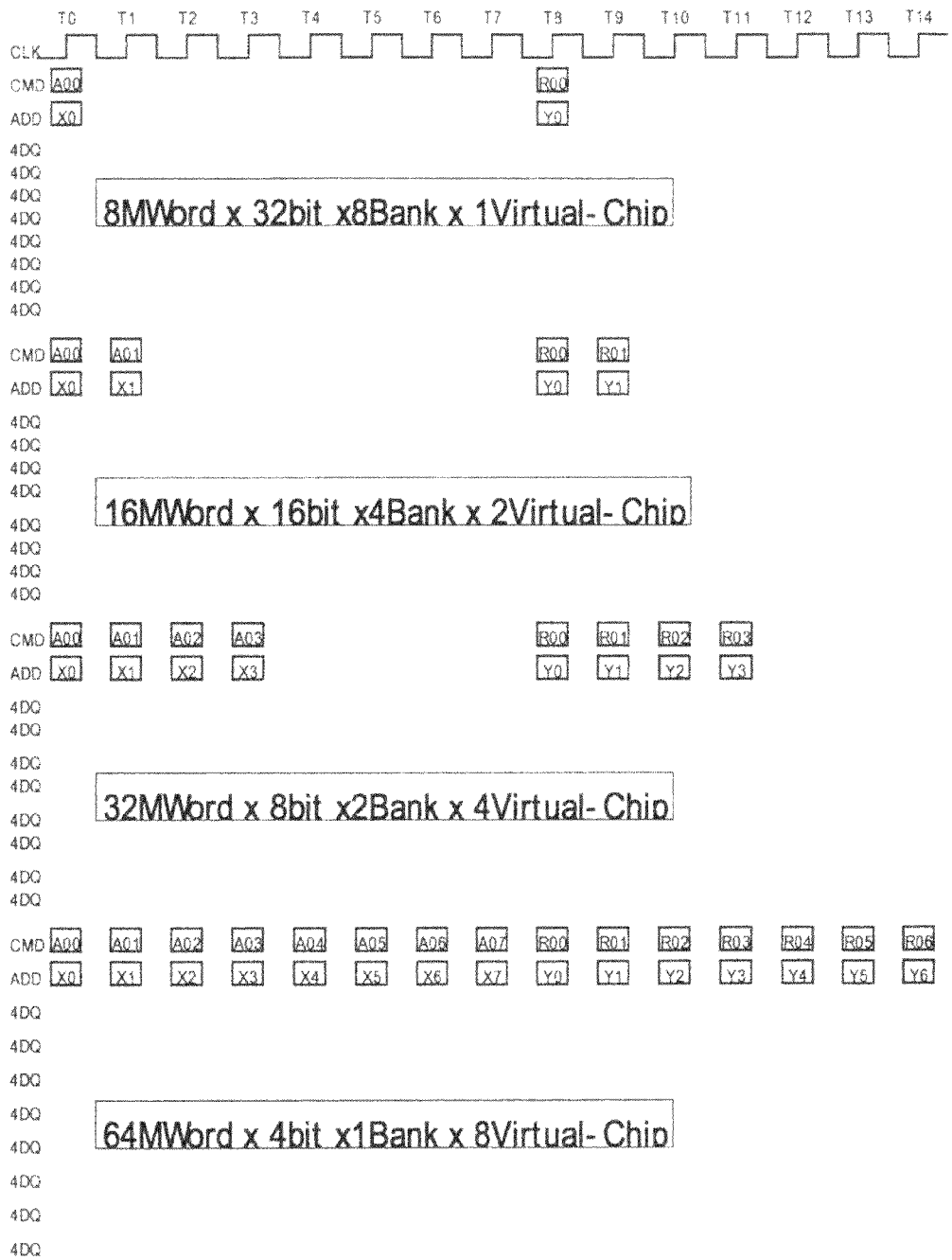
FIG. 2 is a partially expanded view showing a left half portion of FIG. 1.
Figure 3:
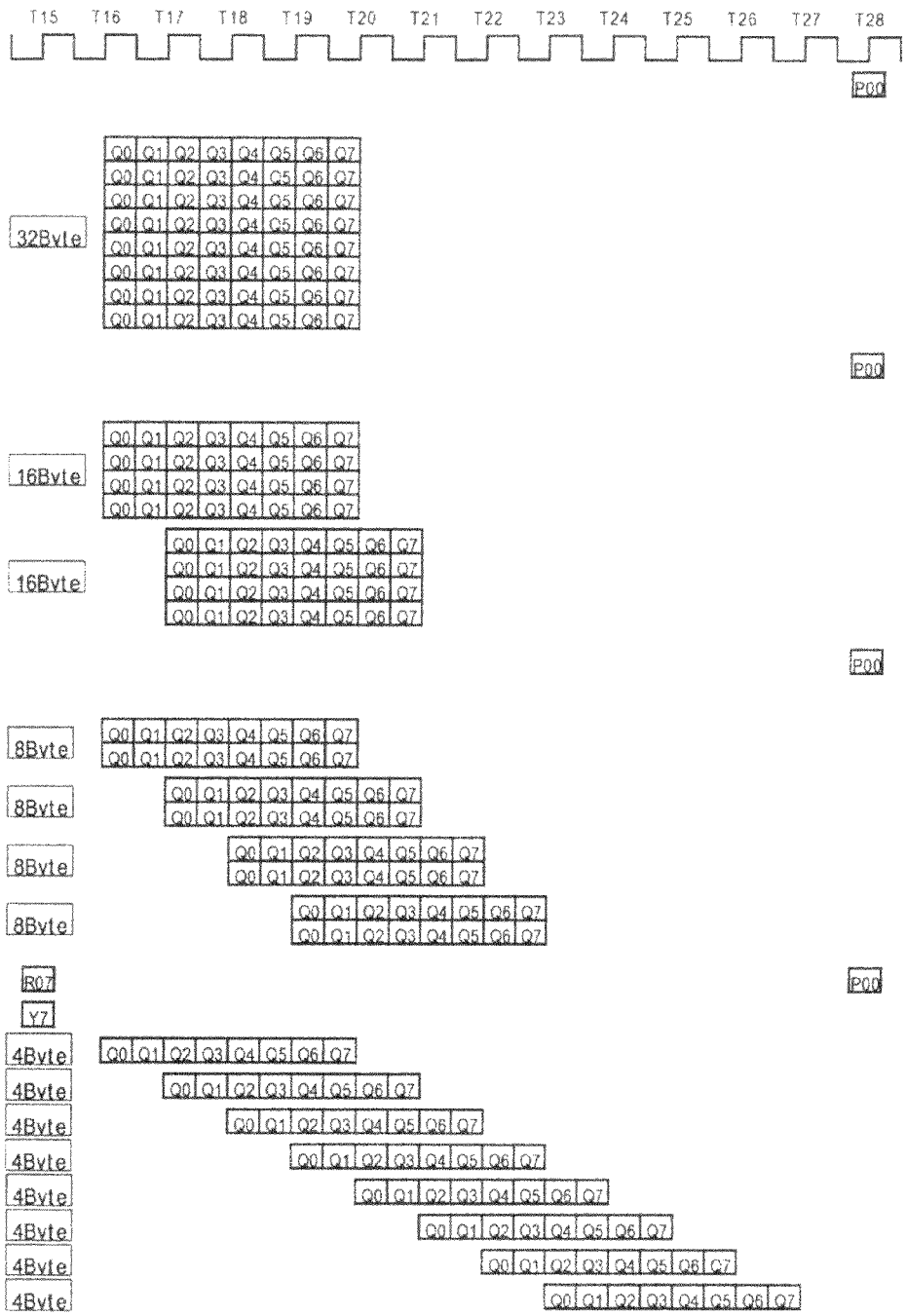
FIG. 3 is a partially expanded view showing a right half portion of FIG. 1.
Figure 5:
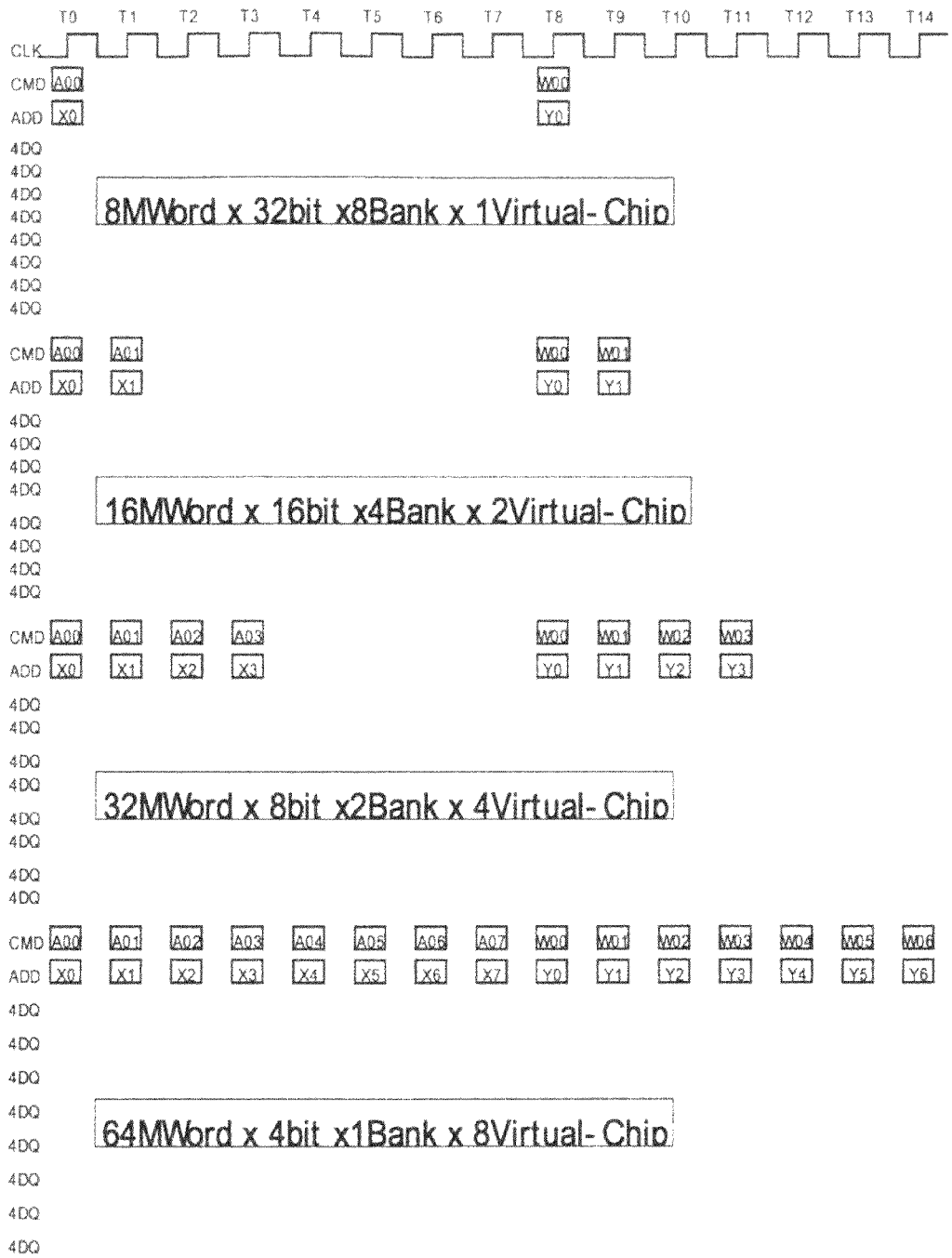
FIG. 5 is a partially expanded view showing a left half portion of FIG. 4.
Figure 6:
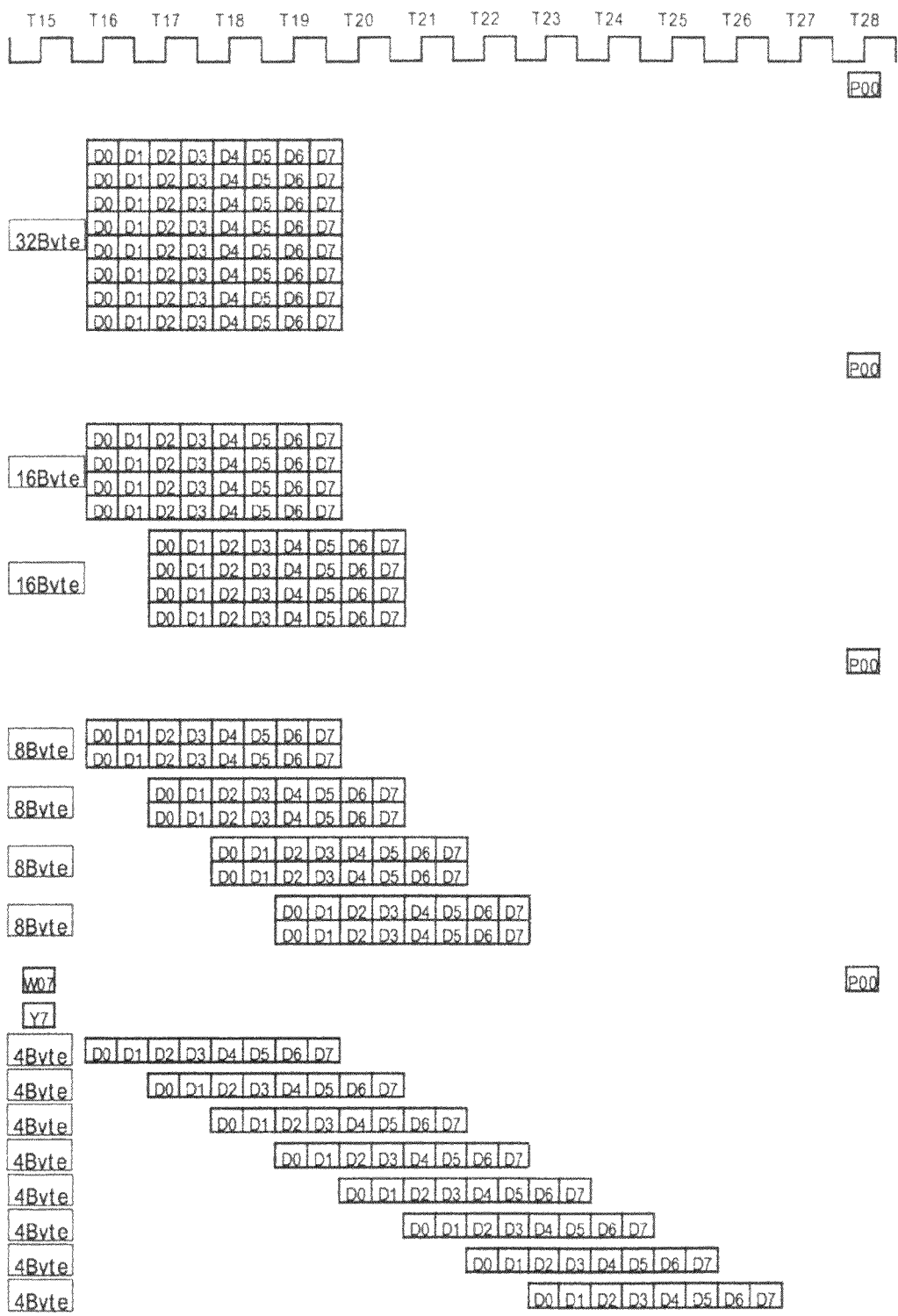
FIG. 6 is a partially expanded view showing a right half portion of FIG. 4.

FIG. 2 is a partially expanded view showing a left half portion of FIG. 1, while FIG. 3 is a partially expanded view showing a right half portion of FIG. 1. FIG. 5 is a partially expanded view showing a left half portion of FIG. 4, while FIG. 6 is a partially expanded view showing a right half portion of FIG. 4.

Referring to FIGS. 1 and 4, CLK denotes a clock, CMD denotes commands (of which A00 denotes a bank active command, R00 denotes a read command, W00 denotes a write command, and P00 denotes a precharge command). ADD denotes an address signal (of which X0 denotes an X (row) address, and Y0 denotes a Y (column) address). 4DQ denotes four data terminals DQ.

FIGS. 1 through 3 show the read operations of an 8MWord×32 Bit×8Bank×1Virtual-Chip configuration, a 16MWord×16 Bit×4Bank×2Virtual-Chip configuration, a 32MWord×8 Bit×2Bank×4Virtual-Chip configuration, and a 64MWord×4 Bit×1Bank×8Virtual-Chip configuration.

It can be seen that I/O accesses in the respective virtual chips are overlapped in timings, being shifted to one another by one clock. The shift by one clock occurs because address and command signals are shared by the respective chips, so that the address and command signals need to be received by time division.

In the 16MWord×16 Bit×4Bank×2Virtual-Chip configuration, a command A00 (for a chip 0) and an address X0 (for the chip 0) are received in response to a clock T0, a command A01 (for a chip 1)and an address X1 (for the chip 1) are received in response to a clock T1, a command R00 (read command for the chip 0) and an address Y0 (for the chip 0) are received in response to a clock T8, and a command R01 (for the chip 1) and an address Y1 (for the chip 1) are received in response to a clock T9.

In the 32MWord×8 Bit×2Bank×4Virtual-Chip configuration, the command A00 (for a chip 0) and the address X0 (for the chip 0) are received in response to the clock T0, the command A0 (for a chip 1) and the address X1 (for the chip 1) are received in response to the clock T1, a command A02 (for a chip 2) an address X2 (for the chip 2) are received in response to a clock T2, and a command A03 (for a chip 3) and an address X3 (for the chip 3) are received in response to a clock T3. The command R00 (for the chip 0) and the address Y0 (for the chip 0) are received in response to a clock T8, the command R01 (for the chip 1) and the address Y1 (for the chip 1) are received in response to the clock T9, a command R02 (for the chip 2) and an address Y2 (for the chip 2) are received in response to a clock T10, and a command R03 (for the chip 3) an address Y3 (for the chip 3) are received in response to a clock T11.

In the 64MWord×4Bit×1Bank×8Virtual-Chip configuration, the command A00 (for a chip 0) and the address X0 (for the chip 0) are received in response to the clock T0, the command A01 (for a chip 1) and the address X1 (for the chip 1) are received in response to the clock T1, the command A02 (for a chip 2)and the address X2 (for the chip 2) are received in response to the clock T2, and the command A03 (for a chip 3) and the address X3 (for the chip 3) are received in response to the clock T3. A command A04 (for a chip 4) and an address X4 (for the chip 4) are received in response to a clock T4, a command A05 (for a chip 5) and an address X5 (for the chip 5) are received in response to a clock T5, a command A06 (for a chip 6) and an address X6 (for the chip 6) are received in response to a clock T6, and a command T07 (for a chip 7) and an address X7 (for the chip 7) are received in response to a clock T7. The command R00 (for the chip 0) and the address Y0 (for the chip 0) are received in response to the clock T8, the command R01 (for the chip 1) and the address Y0 (for the chip 0) are received in response to the clock T8, and the command R01 and the address Y1 are received in response to a clock T9. In response to the clock T10, the command R02 and the address Y2 are received. In response to the clock T11, the command R03 and the address Y3 are received. In response to a clock T12, a command R04 and an address Y4 are received. In response to a clock T13, a command R05 and an address Y5 are received. In response to a clock T14, a command R06 and an address Y6 are received. In response to a clock T15, a command R07 and an address Y7 are received.

By imposing constraints as described above, while keeping compatible with pins of a conventional product, introduction of the virtual chips become possible. A plurality of banks may be held in each virtual chip.

As described above, referring to FIGS. 1 through 3, in response to the clock T0, the bank active command A00 (which activates a bank 0 in the virtual chip 0, and in which the first zero indicates a bank address, and the succeeding zero indicates identification of the virtual chip) and the selected row address X0 are received. Then, in response to the clock T8, the read command R00 (based on which reading from the bank 0 in the virtual chip 0 is performed, and in which the first zero indicates the bank address, and the succeeding zero indicates the identification of the virtual chip) and the selected column address Y0 are received.

Then, after a latency of a certain period, output data Q0 to Q7 are burst output at a double data rate in response to clocks after the clock T16. Herein, one Q data indicates the data of four bits, in view of the size of the drawings.

Accordingly, FIG. 1 shows that the data of 32 bits are read out through 32 DQ pins in a burst of eight bits. Accordingly, in this one-time read access, the data of 32 bytes are read from one virtual chip.

In the case of the two virtual chips (each with the 16MWord×16 Bit×4Bank configuration), the number of words in each virtual chip doubles and a bit configuration in each virtual chip is halved, compared with the 8MWord×32 Bit×8Bank×1 Virtual-Chip configuration.

So far, product family provision in this embodiment is the same as a conventional product family provision method. However, according to this embodiment, the number of banks is further halved, and at the same time, the number of virtual chips is doubled.

Differing from a bank, the virtual chip has independent DQ pins. For this reason, data reading from different virtual chips may overlap.

Then, the active command A00 and the row address X0 for the virtual chip 0 can be received in response to the clock T0, and the active command A01 and the row address X1 for the virtual chip 1 can be received in response to the clock T1, for example.

Next, the read command R00 and the column address Y0 can be received in response to the clock T8. Then, the read command R01 and the column address Y1 can be received in response to the clock T9.

Then, after the latency of the certain period, output data Q0 to Q7 are burst output from the virtual chip 0 at the double data rate, in synchronization with the clocks after the clock T16.

Further, from the virtual chip 1, output data Q0 to Q7 are burst output at the double data rate in synchronization with the clocks after a clock T17 and subsequent clocks.

Since each virtual chip has an x16 bit configuration, respective data of 16 bytes can be read out, being shifted to each other by one clock.

Accordingly, a data transfer rate that is substantially equal to a data transfer rate (referred to as a bandwidth as well) of 32 bytes in the case of the one virtual chip can be implemented in the two virtual chips as well.

Since the respective virtual chips share address and command pins in the one chip, signals to be input into the address and command pins need to be received by time division.

Referring to FIG. 1, the address signals are received at timings shifted by one clock, and the command signals are received at timings shifted by one clock. As long as these signals are synchronized with the clocks without being overlapped, these signals can be input at any timing.

Though product family provision of four virtual chips and eight virtual chips is shown, the product family provision is basically performed on the same principle, and operations of the four virtual chips and the eight virtual chips are controlled in a similar manner. Thus, detailed description about the four virtual chips and the eight virtual chips will be herein omitted.

Referring to FIG. 1, reading from each virtual chip is finished in one burst length. However, as long as timings (referred to as slots) at which the commands and the addresses for each virtual chip are input are free, consecutive reading from another address within the same bank may be performed, or a different bank may be activated and reading from the different bank may be consecutively performed, in each virtual chip, as in the conventional product.

FIGS. 4 through 6 show examples of product family provision of the DRAM bit configurations of the present invention and an input/output waveform in each configuration when writing is performed. Chip configurations and a product family provision method in FIGS. 4 through 6 are the same as those in FIGS. 1 through 3. FIGS. 4 through 6 show write operations on the 8MWord×32 Bit×8Bank×1Virtual-Chip configuration, 16MWord×16 Bit×4Bank×2Virtual-Chip configuration, 32MWord×8 Bit×2Bank×4Virtual-Chip configuration, and 64MWord×4 Bit×1Bank×8Virtual-Chip configuration.

The one virtual-chip configuration has completely the same configuration as the common DDR3-SDRAM of the 8MWord×32 Bit×8Bank configuration and can perform same operations as the common DDR3-SDRAM.

For example, in response to the clock T0, the bank active command A00 and the selected row address X0 are received.

Then, in response to the clock T8, a write command W00 (based on which writing into the bank 0 in the virtual chip is performed, and in which the first zero indicates the bank address, and the succeeding zero indicates the identification of the virtual chip) and the selected column address Y0 are received.

Then, after the latency of a certain period, input data Q0 to Q7 are burst input at the double data rate in synchronization with the clocks after the clock T16. Herein, referring to FIGS. 4 through 6, one DQ data indicates the data of four bits. Accordingly, FIGS. 4 through 6 show that the data of 32 bits are simultaneously written through 32 DQ pins in a burst of eight bits. Thus, in this one-time write access, the data of 32 bytes are written into one virtual chip.

In the case of the two virtual chips of (the 16MWord×16 Bit×4Bank configuration), the number of the words doubles and the bit configuration of each virtual chip is halved. So far, the product family provision in this embodiment is the same as the conventional product family provision method. However, in the present invention, the number of the banks is further halved, and at the same time, the number of the virtual chips is doubled. Differing from the bank, the virtual chip has independent DQ pins.

For this reason, data writing into different virtual chips may overlap in timings.

Then, the active command A00 and the row address X0 for the virtual chip 0 can be received in response to the clock T0, and the active command A01 and the row address X1 for the virtual chip 1 can be received in response to the clock T1, for example.

Next, the write command W00 and the column address Y0 can be received in response to the clock T8. Then, a write command W01 and the column address Y1 can be received in response to the clock T9.

Then, after the latency of the certain period, input data D0 to D7 are burst input into the virtual chip 0 at the double data rate, in synchronization with the clocks after the clock T16.

Further, to the virtual chip 1, input data D0 to D7 are burst input at the double data rate in synchronization with the clocks after the clock T17 and the subsequent clocks.

Since each virtual chip has the x16 bit configuration, respective data of 16 bytes can be written, being shifted to each other by one clock.

Accordingly, a data transfer rate that is substantially equal to the data transfer rate of 32 bytes of the one virtual chip can be implemented by the two virtual chips.

Since the respective virtual chips share the address and command pins in the one chip, signals to be input through these address and command pins need to be supplied by time division.

Referring to FIGS. 4 through 6, the address signals are received at timings shifted by one clock, and the command signals are received at timings shifted by one clock. As long as these signals are not overlapped, these signals which are synchronized with clocks can be input at any timing.

Though the product family provision of the four virtual chips and the eight virtual chips is shown, the product family provision is basically performed on the same principle, and the operations of the four virtual chips and the eight virtual chips are controlled in the similar manner. Thus, detailed description of the four virtual chips and the eight virtual chips will be herein omitted.

Referring to FIGS. 4 through 6, writing into each virtual chip is finished in one burst length. However, as long as timings at which the commands and the addresses for each virtual chip are input are free, consecutive writing into another address within the same bank may be performed, or a different bank may be activated and writing into the different bank may be consecutively performed, in each virtual chip, as in the conventional product.

FIGS. 7 through 10 are diagrams showing internal block configuration diagrams of the four product families of the virtual chips and flows (signal flows) of internal signals when reading operations are performed.

Each product family is composed of a bank/virtual chip (represented by "VC") address buffer, a buffer for a row address (composed of bits XA0 to XA13), a buffer for column addresses (composed of bits YA0 to YA8, YA9, YA10, or YA11), eight memory arrays (each corresponding to one bank) of a 256 Mbit configuration, one or more selectors, serializers, and DQ buffers (constituted from eight sets of four DQ buffers, which totals 32 DQ buffers).

These components are the same in provision of the four product families, and grouping of these components and a selector configuration are different.

Figure 7:
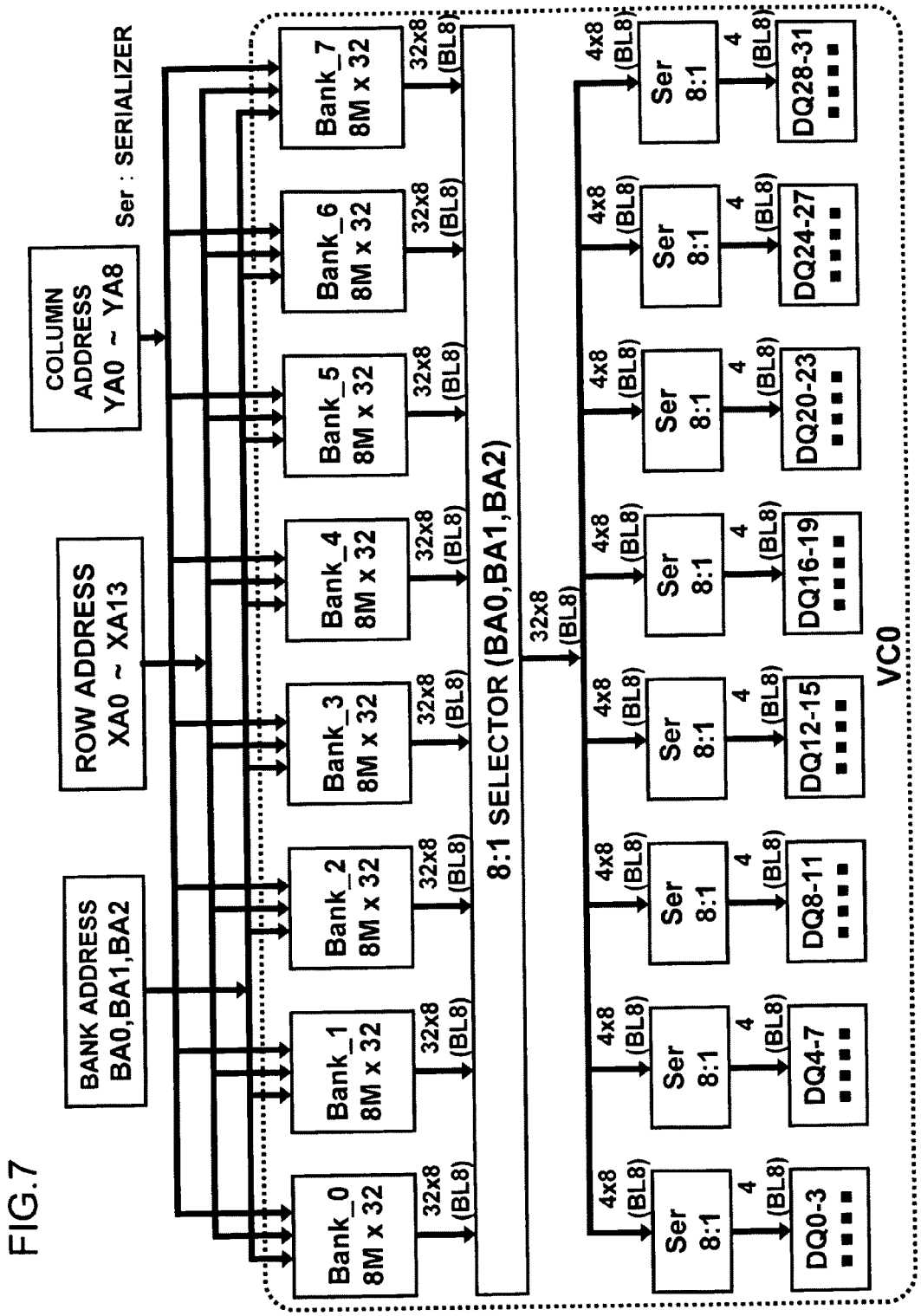
FIG. 7 is a diagram showing (reading from) an 8M×32× 8Bank×1VC configuration in the embodiment of the present invention.

As shown in FIG. 7, in the case of the one VC (8M×32× 8Bank×1VC) configuration, the one VC has eight banks. Each bank address (BA0, BA1, and BA2) is constituted from three bits, and no VC address is present. Each of Bank_0 to Bank_7 has an 8M×32 bit configuration. An 8:1 selector that selects one bank from the eight banks is included. 32×8 bits are output to DQ buffers DQ0 to 3, DQ4 to 7, DQ8 to 11, DQ12 to 15, DQ16 to 19, DQ20 to 23, DQ24 to 27, and DQ28 to 31 through 8:1 serializers (Ser 8:1).

Figure 8:
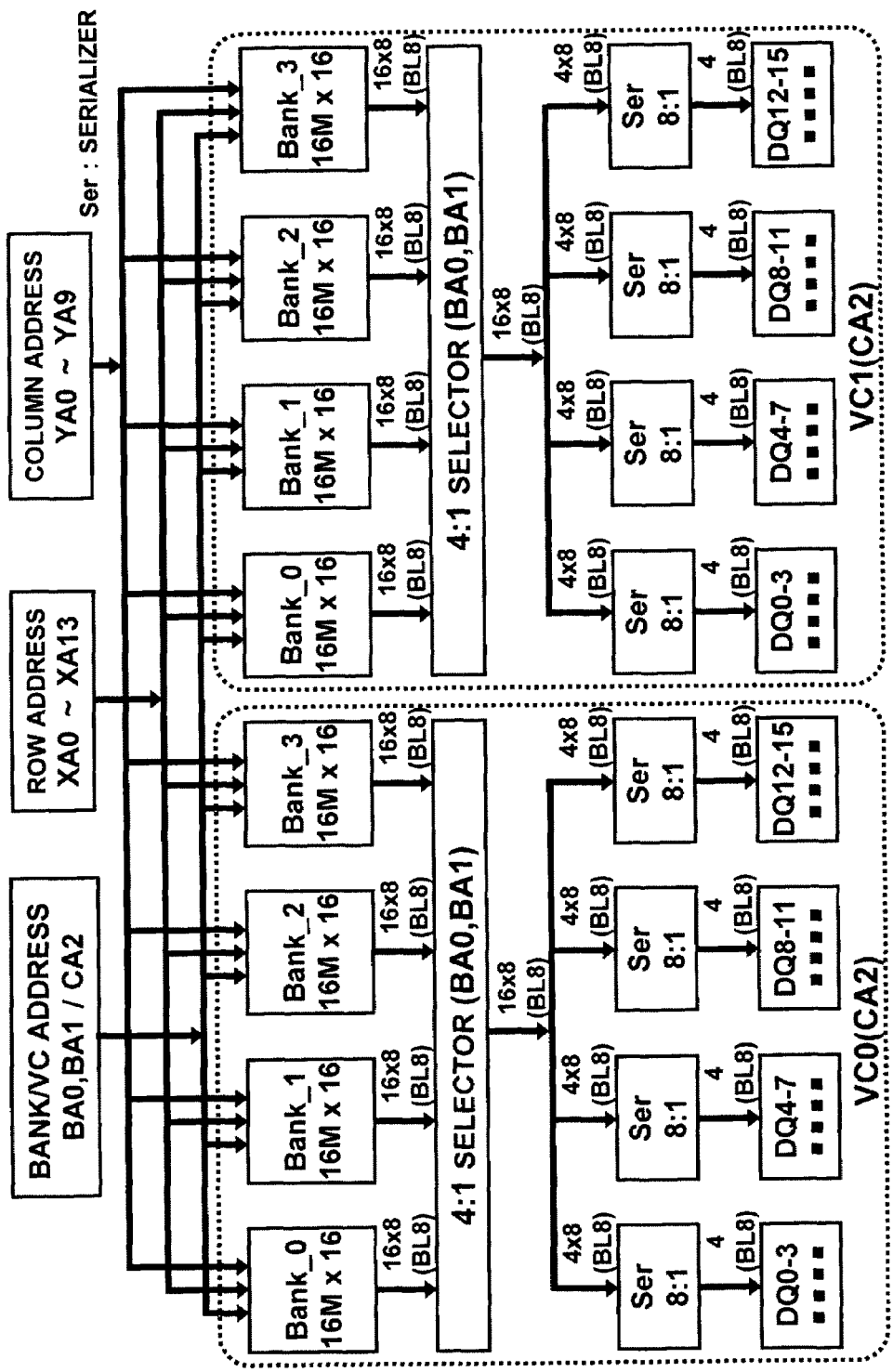
FIG. 8 is a diagram showing (reading from) a 16M×16× 4Bank×2VC configuration in the embodiment of the present invention.

As shown in FIG. 8, in the case of the two VC (16M×16× 4Bank×2VC) configuration, each of the two VCs has four banks. Then, each bank address is constituted from two bits (BA0 to BA1). Each VC address is constituted from one bit (CA2). In each of the VC0 and the VC1, each of the four banks has a 16M×16 bit configuration. An output of 16×8 bits from a 4:1 selector that selects one of the four banks based on the bits BA0 and BA1 is output from terminals DQ0 to 3, DQ4 to 7, DQ8 to 11, and DQ12 to 15 through four 8:1 serializers.

Figure 9:
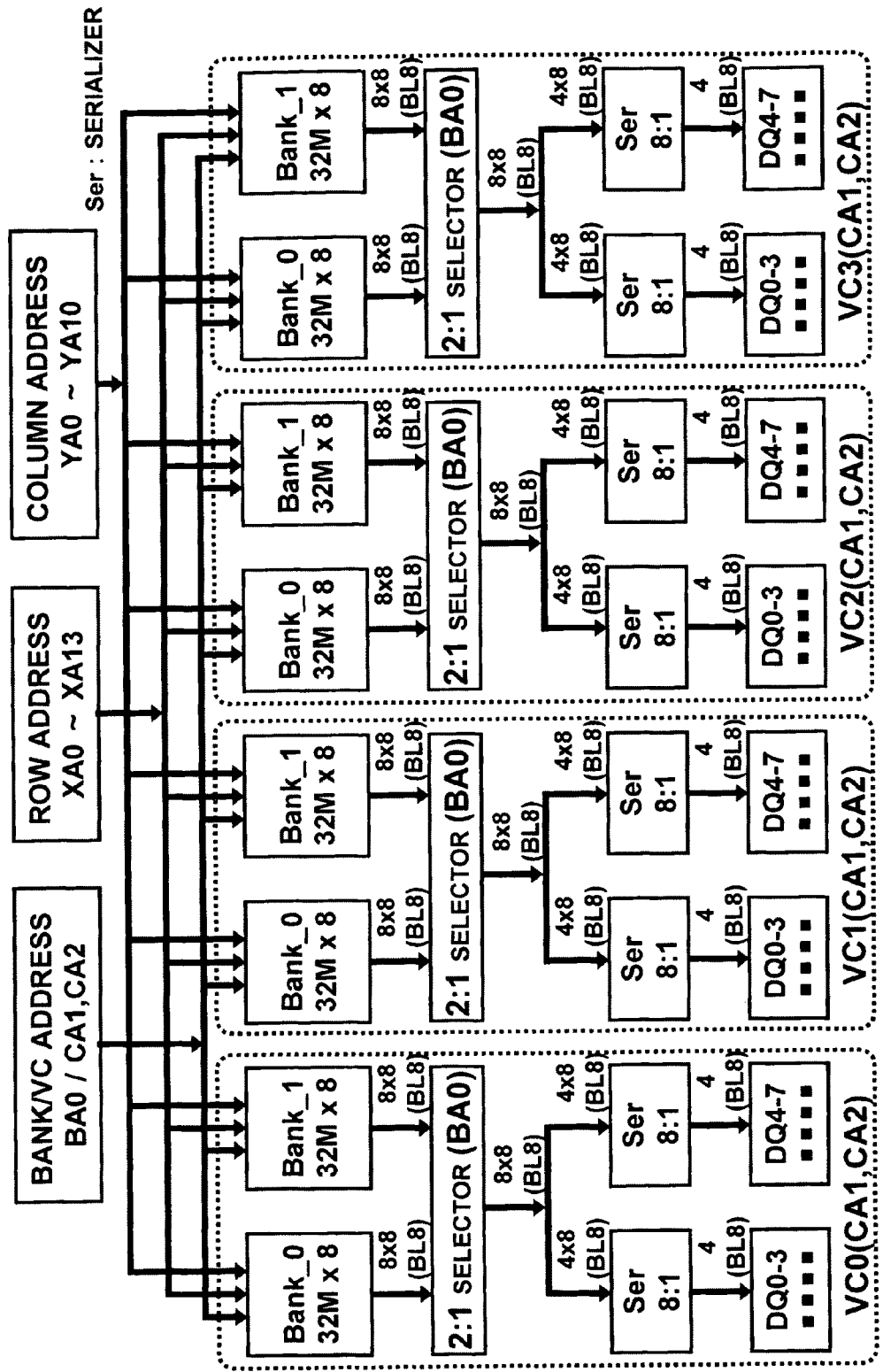
FIG. 9 is a diagram showing (reading from) a 32M×8× 2Bank×4VC configuration in the embodiment of the present invention.

As shown in FIG. 9, in the case of the four VC (32M×8× 2Bank×4VC) configuration, each of the four VCs has two banks. Each bank address is constituted from one bit (BA0). Each VC address is constituted from two bits (CA1, CA2). In each of VC0, VC1, VC2, and VC3, each of the two banks has a 32M×8 bit configuration. An output of 8×8 bits from a 2:1 selector that selects one of the two banks based on the bit BA0 is output from terminals DQ0 to DQ3, DQ4 to DQ7 through two 8:1 serializers.

Figure 10:
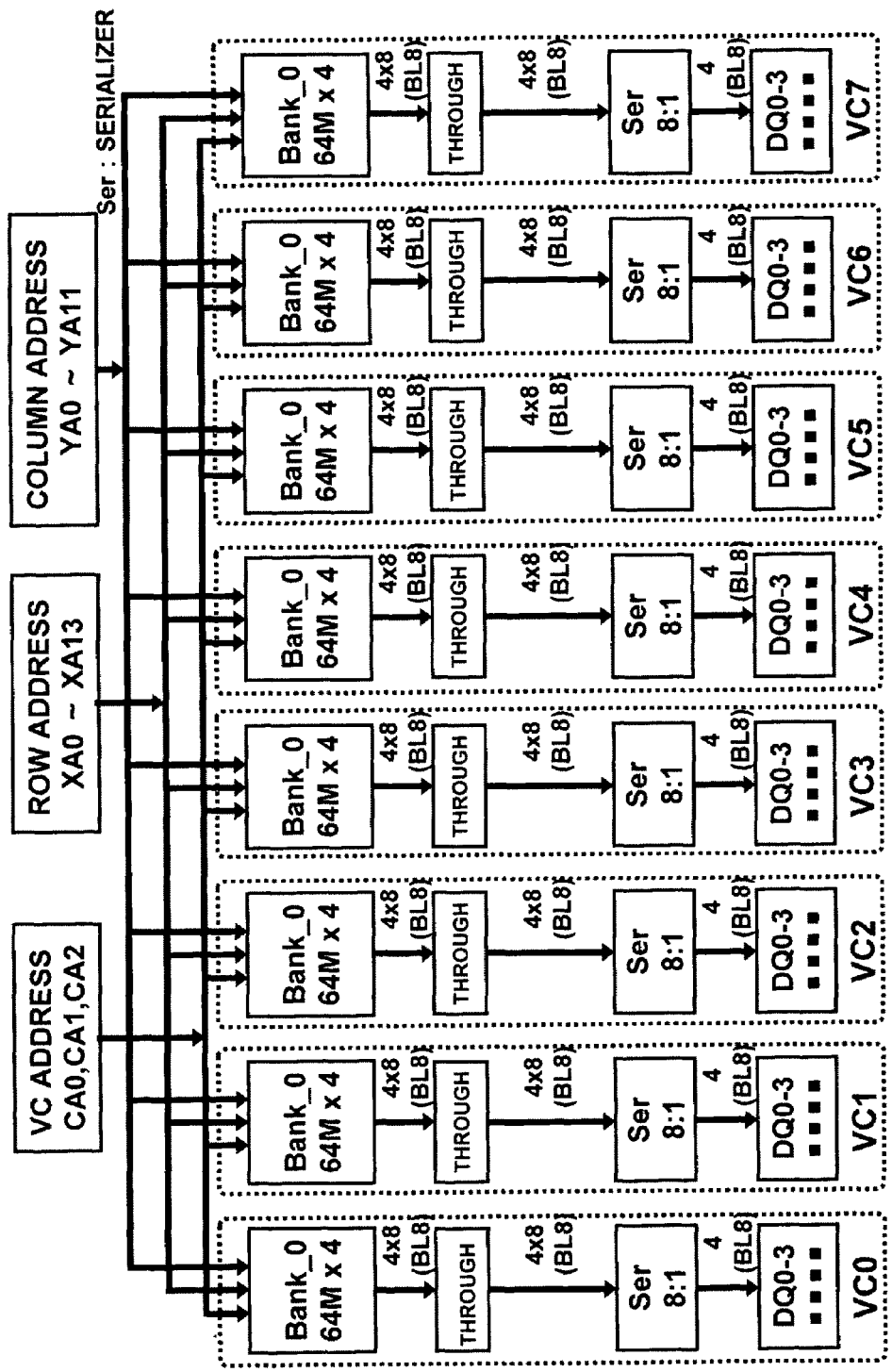
FIG. 10 is a diagram showing (reading from) a 64M×4× 1Bank×8VC configuration in the embodiment of the present invention.

As shown in FIG. 10, in the case of the eight VC (64M×4× 1Bank×8VC) configuration, each of the eight VCs has one bank. No bank address is present. Each VC address is constituted from three bits (CA0 to CA2). In each of VC0 to VC7, each bank has a 64M×4 bit configuration. 4×8 bits are output from terminals DQ0 to DQ3 through an 8:1 serializer.

In the provision of these product families, the sum (the number of bits) of the bank address and the VC address is three bits, which is constant. However, it can be seen that a bank/VC address configuration differs according to each product family. When in the case of the one VC (8M×32× 8Bank×1VC) configuration, the bank/VC address configuration is formed of the bank address bits BA0, BA1, and BA2. In the case of the two VC (16M×16×4Bank×2VC) configuration, the bank/VC address configuration is formed of the bank address bits BA0 and BA1 and the VC address bit CA2. In the case of the four VC (32M×8×2Bank×4VC) configuration, the bank/VC address configuration is formed of the bank address bit BA0 and the VC address bits CA1 and CA2. In the case of the eight VC (64M x4×1Bank×8VC) configuration, the bank/VC address configuration is formed of the VC address bits CA0, CA1, and CA2. According to a difference among these configurations, a control method of the one or more selectors is changed.

The VC address is associated with the number of the one or more selectors, and the bank address is associated with an input-to-output ratio of each of the one or more selectors.

The VC address also serves as a chip enable signal for a corresponding VC.

Just by associating the bank/VC address configuration with the selector configuration and adding enable control for each VC as described above, provision of the virtual chips of the present invention becomes possible. Thus, as will be described later, just by a simple circuit configuration and a change in setting of the mode register, a configuration desired by a user may be provided from one base chip.

The row address (composed of the bits XA0 to XA13) is common to the four product families.

On the other hand, a column address changes as follows:

In the case of the one VC, the column address is composed of nine bits (YA0 to YA8);

In the case of the two VCs, the column address is composed of 10 bits (YA0 to YA9);

In the case of the four VCs, the column address is composed of 11 bits (YA0 to YA10); and In the case of the eight VCs, the column address is composed of 12 bits (YA0 to YA11).

Corresponding to the changes of the column address, each bank of the 256 Mbit configuration changes its configuration to the 8M×32 bit configuration, 16M×16 bit configuration, 32M×8 bit configuration, and 64M×4 bit configuration.

Corresponding to these changes of the bank configuration, the number of the DQ pins in each VC also changes to 32 in the case of the one VC, 16 in the case of the two VCs, eight in the case of the four VCs, and four in the case of the eight VCs.

A method of changing these configurations may be made in the same manner as in the product family provision method in a conventional art.

An address signal is supplied to each address buffer, and then supplied to each bank of 256 Mbits.

Data is read from memory cells selected by the addresses, and is selected by the corresponding one of the one or more selectors according to each VC configuration. Then, selected data is subject to parallel-to-serial conversion by the corresponding one of the serializers, and then output from output buffers.

In this embodiment, the DDR3-SDRAM has the burst length of eight bits. Thus, eight-times bit data for a bit configuration is simultaneously read in parallel from the respective banks, and is converted into a series form of eight bits by the serializer.

FIGS. 11 to 14 show internal block configuration diagrams of the four product families of the virtual chips described above and flows of the internal signals when writing operations are performed.

Each product family includes the bank/virtual chip (represented by VC) address buffer, the buffer for the row address (composed of the bits XA0 to XA13), the buffer for the column addresses (composed of the bits YA0 to YA8, YA9, YA10, or YA11), the eight memory arrays (each corresponding to one bank) each having the 256 Mbit configuration, the one or more selectors, deserializers, and the DQ buffers (constituted from the eight sets of four DQ buffers, which totals the 32 DQ buffers).

These components are the same in the provision of the four product families. Grouping of these components and the selector configuration are changed.

Figure 11:
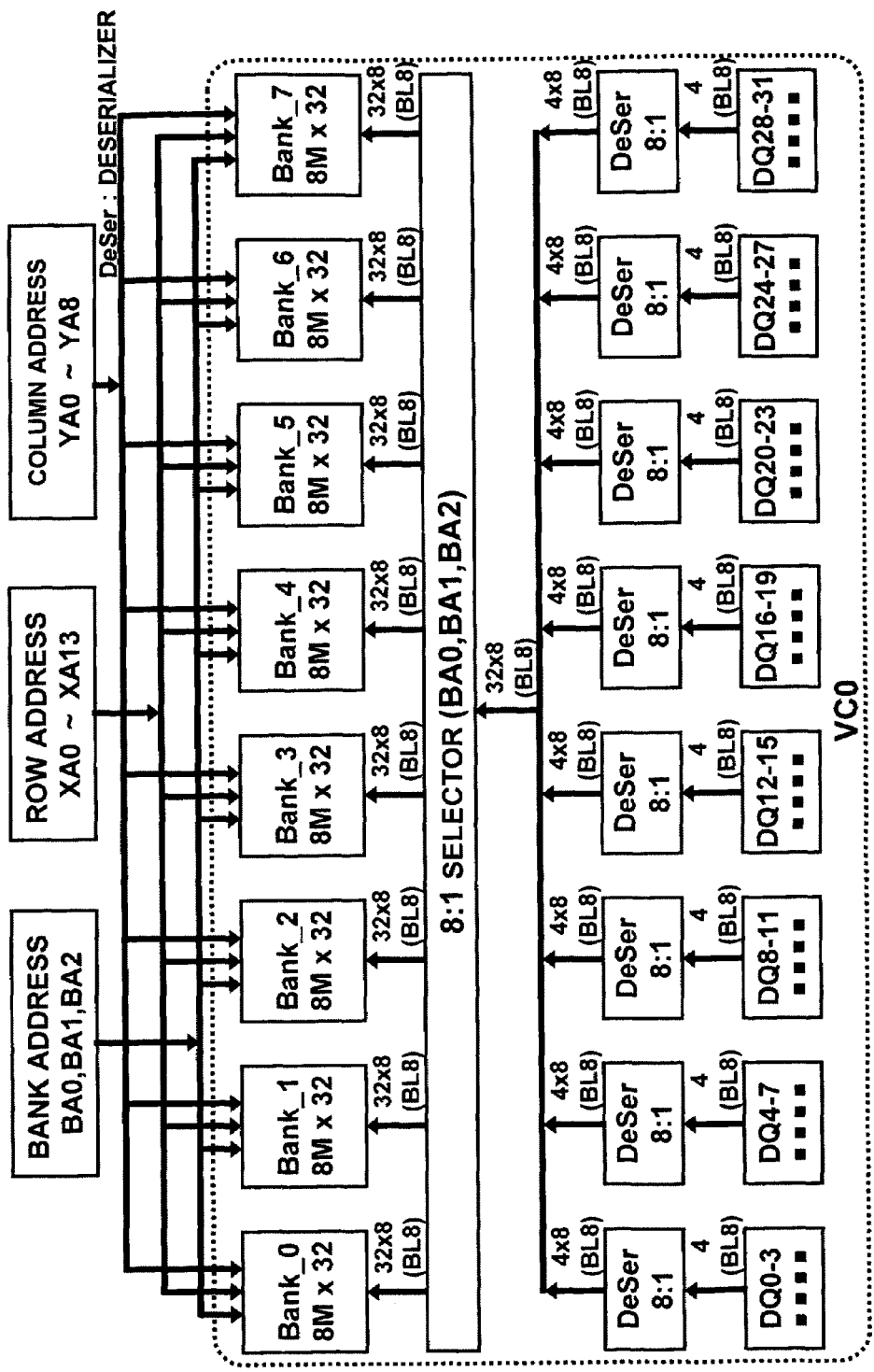
FIG. 11 is a diagram showing (writing into) the 8M×32× 8Bank×1VC configuration in the embodiment of the present invention.

As shown in FIG. 11, when the one VC is formed, the one VC has the eight banks. Each bank address is constituted from the three bits (BA0 to BA2), and no VC address is present.

Figure 12:
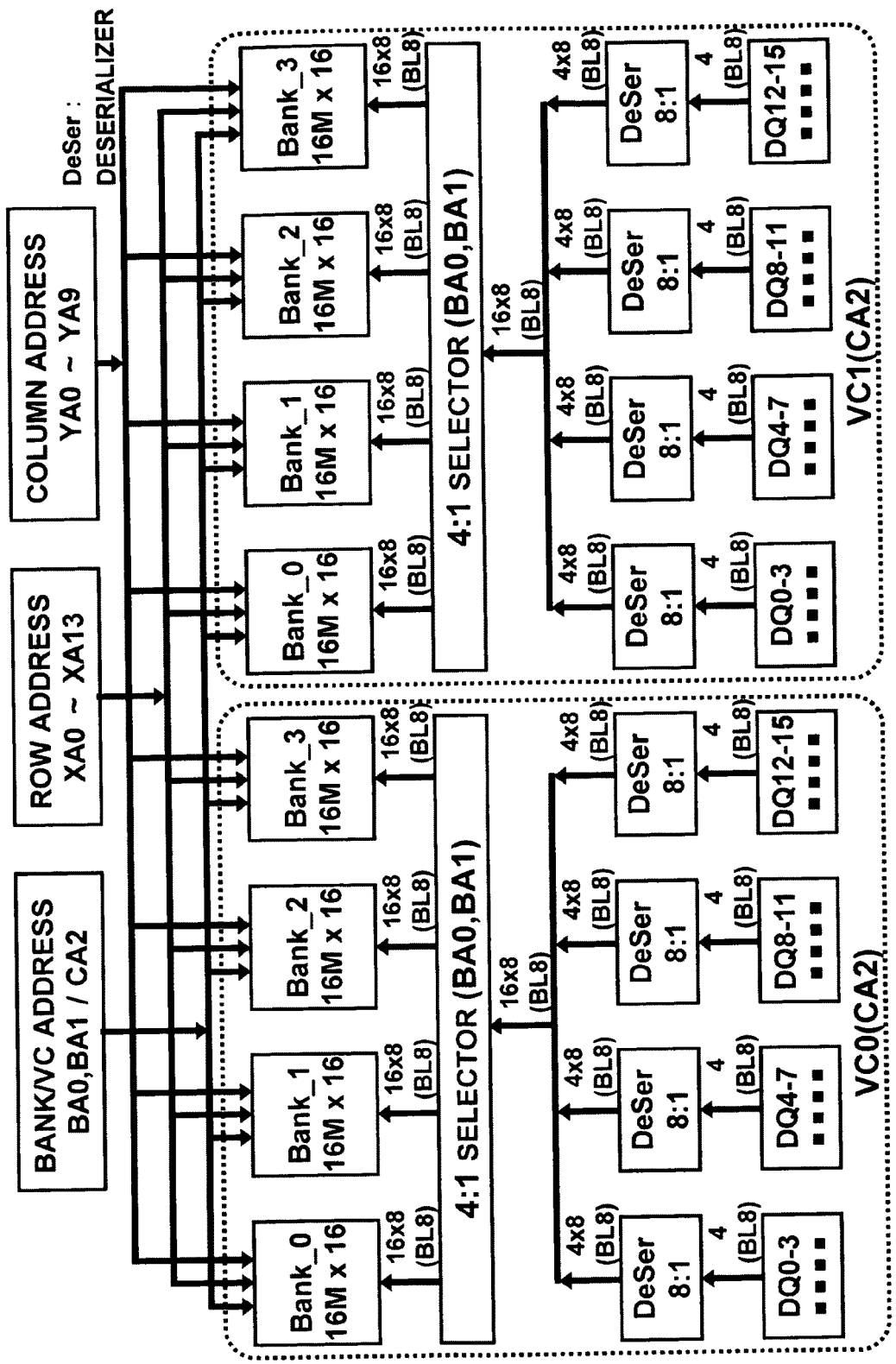
FIG. 12 is a diagram showing (writing into) the 16M×16× 4Bank×2VC configuration in the embodiment of the present invention.

As shown in FIG. 12, when the two VCs are formed, each of the two VCs has the four banks. Then, each bank address is constituted from the two bits (BA0 and BA1). Each VC address is constituted from the one bit (CA2).

Figure 13:
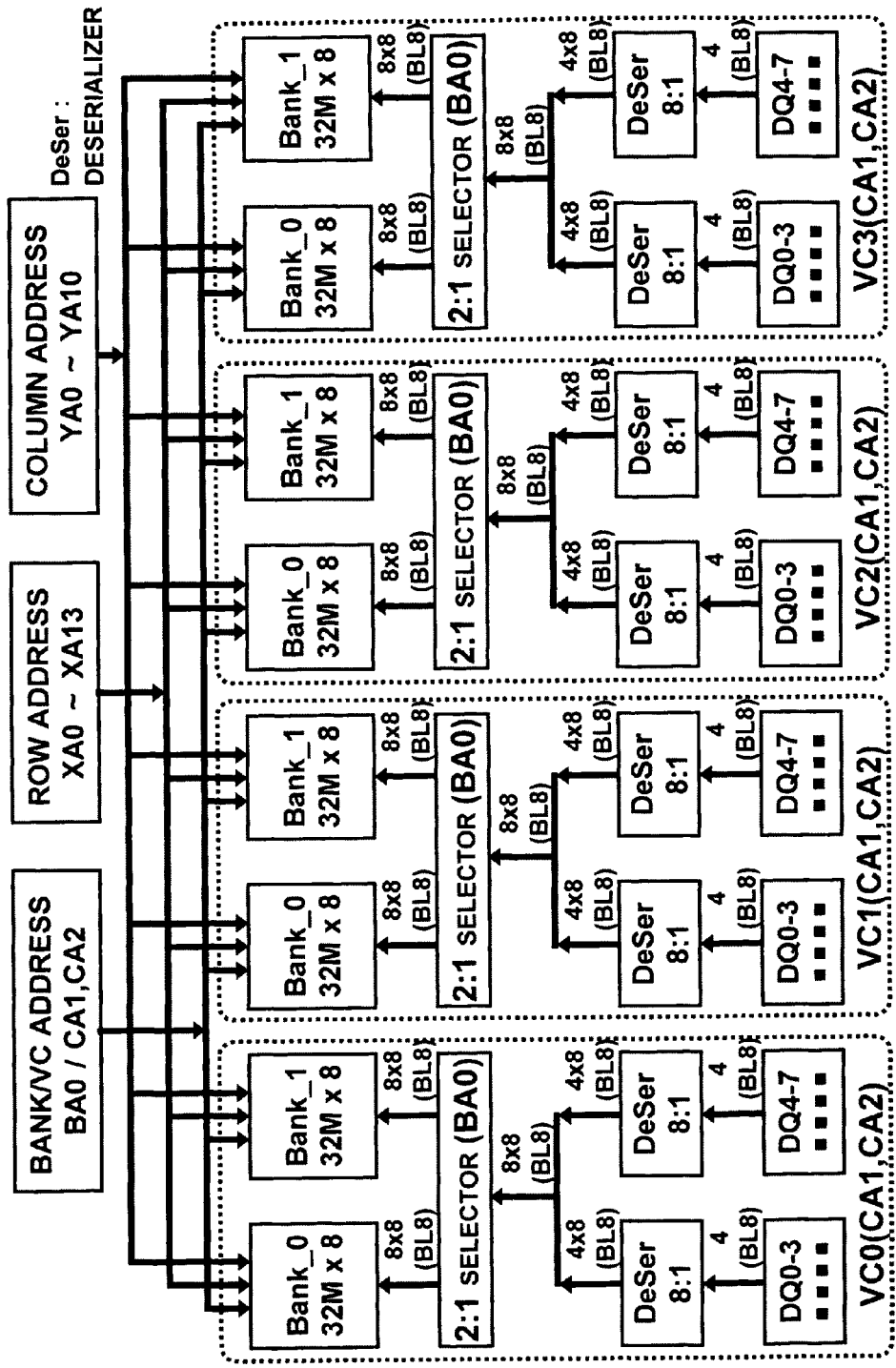
FIG. 13 is a diagram showing (writing into) the 32M×8× 2Bank×4VC configuration in the embodiment of the present invention.

As shown in FIG. 13, when the four VCs are formed, each of the four VCs has the two banks. Each bank address is constituted from the one bit (BA0). Each VC address is constituted from the two bits (CA1, CA2).

Figure 14:
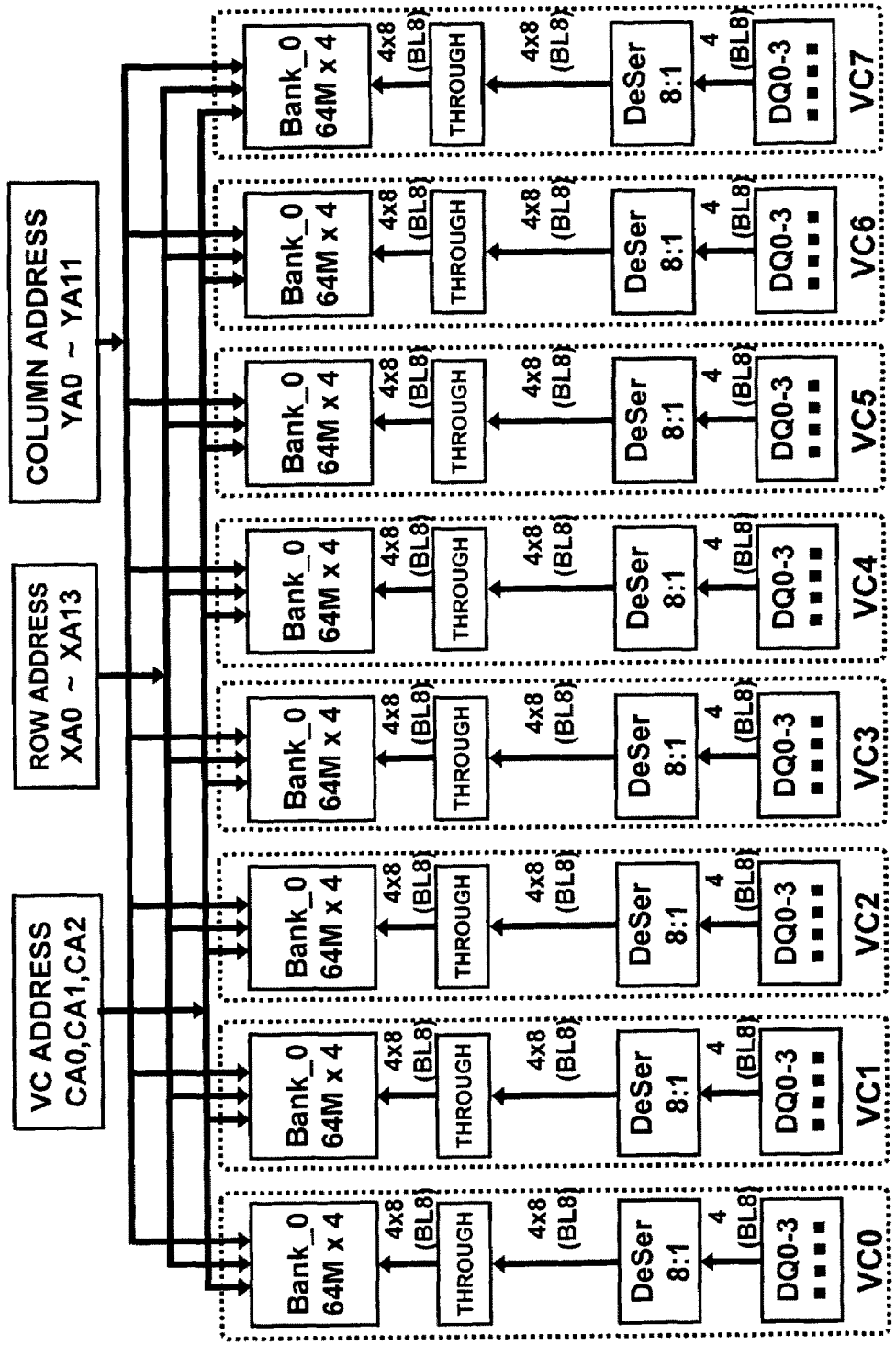
FIG. 14 is a diagram showing (writing into) the 64M×4× 1Bank×8VC configuration in the embodiment of the present invention.

As shown in FIG. 14, when the eight VCs are formed, each of the eight VCs has the one bank. No bank address is present. Each VC address is constituted from the three bits (CA0 to CA2).

It can be seen that in the provision of these product families, the sum of the bank address and the VC address is three bits, which is constant. However, it can be seen that the bank/VC address configuration differs according to each product family.

According to the difference in this configuration, the control method of the one or more selectors is changed.

The VC address is associated with the number of the one or more selectors, and the bank address is associated with the input-to-output ratio of each of the one or more selectors.

The VC address also serves as the chip enable signal for the corresponding VC.

Just by associating the bank/VC address configuration with the selector configuration and adding the enable control for each VC as described above, the provision of the virtual chips of the present invention becomes possible. Thus, as will be described later, just by the simple circuit configuration and the change in the setting of the mode register, the configuration desired by the user may be provided from the one base chip.

The row address (composed of the bits XA0 to XA13) is common to the four product families.

On the other hand, the column address changes as follows:

In the case of the one VC, the column address is composed of the nine bits (YA0 to YA8);

In the case of the two VCs, the column address is composed of the 10 bits (YA0 to YA9);

In the case of the four VCs, the column address is composed of the 11 bits (YA0 to YA10); and In the case of the eight VCs, the column address is composed of the 12 bits (YA0 to YA11). Corresponding to the changes of the column address, each bank of the 256 Mbit configuration changes its configuration to the 8M×32 bit configuration, 16M×16 bit configuration, 32M×8 bit configuration, and 64M×4 bit configuration.

Corresponding to the changes of the bank configuration, the number of the DQ pins in each VC also changes to 32, 16, eight, and four.

The method of changing these configurations may be made in the same manner as in the product family provision method in the conventional art.

The address signal is supplied to each address buffer, and then supplied to each bank of 256 Mbits.

Write data for memory cells selected by the addresses is input to data input buffers, and is then subject to serial-to-parallel conversion by the corresponding one of the deserializers. Then, the converted data is selected by the corresponding one of the one or more selectors according to each VC configuration. The selected data is sent to the corresponding bank and is then written into the memory cells selected by the address.

In this exemplary embodiment, the DDR3-SDRAM has the burst length of eight bits. Thus, consecutive data of eight bits is externally written into each data pin, and is converted into a parallel form of the eight bits by each deserializer.

FIG. 15A shows a configuration of the bank of 256 Mbits. Using the 14-bit row address (composed of the bits XA0 to XA13) and the 9-bit column address (composed of the bits YA0 to YA8), 32-bit (8M×32) memory cells are simultaneously selected.

Three selection signals S16, S8, and S4 are respectively controlled for the four product families of the x32, x16, x8, and x4 configurations, as shown in FIG. 15B.

According to this control, enabling/disenabling of the column address bits YA9 to YA11 is controlled, and the simultaneously selected 32-bit memory cells are associated with one of 32-bit, 16-bit, 8-bit, and 4-bit configurations.

Reference numerals D0 to D7 in FIG. 15A respectively indicate 4-bit data (the number of bits from the data D0 to D7 totaling 32 bits). For the respective (x32, x16, x8, x4) bit configurations, signals each marked by a circle are enabled, in FIG. 15C.

When the signal S16 is Low, outputs of a NAND 101 and an inverter 102 go High. Then, all of transfer gates 103, 104, and 106 are turned on, and transfer gates 107 are turned off. When the signal S16 is High, the transfer gates 106 are turned off. When the signal S16 is High and a signal YA9 is High, an output of the NAND 101 goes Low, the transfer gates 103 and 104 are turned off, and then the transfer gates 107 are turned on.

When the signal S8 is Low, outputs of a NAND 111 and an inverter 112 go High. Then, transfer gates 113, 114, and 116 are turned on, and transfer gates 117 are turned off. When the signal S8 is High, the transfer gates 116 are turned off. When the signal S8 is High and a signal YA10 is High, an output of the NAND 111 goes LOW, the transfer gates 113 and 114 are turned off, and then the transfer gates 117 are turned on.

When the signal S4 is Low, outputs of a NAND 121 and an inverter 122 go High. Then, transfer gates 123, 124, and 126 are turned on, and a transfer gate 127 is turned off. When the signal S4 is High, the transfer gate 126 is turned off. When the signal S4 is High and a signal YA11 is High, an output of the NAND 121 goes LOW, the transfer gates 123 and 124 are turned off, and then the transfer gate 127 is turned on.

When the signals S16, S8, and S4 are Low, data lines (input/output lines) are connected to DQ terminals D0 to D7 (which corresponds to the x32 configuration in FIG. 15C).

When the signal S16 is High, the signal S8 is Low, the signal S4 is Low, and the signal YA9 is High, the output of the NAND 101 goes LOW. Then, the transfer gates 107 are turned on, and the transfer gates 103, 104, and 106 are turned off. Connection of the DQ terminal D1 to a data line (10 line) corresponding to the DQ terminal D1 is turned off, and the DQ terminal D0 is connected to the data line corresponding to the DQ terminal D1 through a corresponding transfer gate 107. Connection of the DQ terminal D3 to a data line corresponding to the DQ terminal D3 is turned off, and the DQ terminal D2 is connected to the data line corresponding to the DQ terminal D3 through a corresponding transfer gate 107. Connection of the DQ terminal D5 to a data line corresponding to the DQ terminal D5 is turned off, and the DQ terminal D4 is connected to the data line corresponding to the DQ terminal D5 through a corresponding transfer gate 107. Connection of the DQ terminal D7 to a data line corresponding to the DQ terminal D7 is turned off, and the DQ terminal D6 is connected to the data line corresponding to the DQ terminal D7 (which corresponds to the x16 configuration in FIG. 15C).

When the signal S16 is High, the signal S8 is High, the signal S4 is Low, the signal YA9 is High, and the signal YA10 is High, the output of the NAND 101 goes Low. An output of the inverter 102 goes Low. Then, the transfer gates 107 are turned on, and the transfer gates 103, 104, and 106 are turned off. The output of the NAND 111 goes Low, the transfer gates 117 are turned on, and the transfer gates 113, 114, and 116 are turned off. The output of the NAND 121 goes High, the transfer gate 127 is turned off, and the transfer gates 123 and 124 are turned on. The transfer gate 126 that receives an inverted signal of the signal S4 is turned on. Paths between the DQ terminals D1, D2, and D3 and the corresponding data lines are turned off. The DQ terminal D0 is then connected to the data line corresponding to the D3 terminal through the transfer gate 123, transfer gate 117 between a data line for the DQ terminal D0 and the data line for the DQ terminal D2, and transfer gate 107 between the data lines for the DQ terminals D2 and D3. Similarly, paths between the DQ terminals D5, D6, and D7 and the corresponding data lines are turned off. The DQ terminal D4 is then connected to the data line corresponding to the D7 terminal through the transfer gates 126 and 124, transfer gate 117 between the DQ terminals D4 and D6, and transfer gate 107 between the DQ terminals D6 and D7 (which corresponds to the x8 configuration in FIG. 15C).

When the signal S16 is High, the signal S8 is High, the signal S4 is High, the signal YA9 is High, the signal YA10 is High, and the signal YA11 is High, the output of the NAND 101 goes Low. The output of the inverter 102 goes Low. Then, the transfer gates 107 are turned on, and the transfer gates 103, 104, and 106 are turned off. The output of the NAND 111 goes Low, the transfer gates 117 are turned on, and the transfer gates 113, 114, and 116 are turned off. The output of the NAND 121 goes Low, the transfer gate 127 is turned on, and the transfer gates 123 and 124 are turned off. The transfer gate 126 that receives the inverted signal of the signal S4 is turned off. The paths between the DQ terminals D1, D2, D3, D4, D5, D6, and D7 and the corresponding data lines are turned off. The DQ terminal D0 is connected to the data line corresponding to the D7 terminal through the transfer gate 127, transfer gate 117 between the DQ terminals D4 and D6, and transfer gate 107 between the DQ terminals D6 and D7 (which corresponds to the x4 configuration in FIG. 15C).

The configurations in FIGS. 15A to 15C can be used without alteration for both of data reading and data writing. Selection examples among the selection signals S16, S8 and S4 and the x32 to x4 configurations shown in FIG. 15B, and the configuration of the bank shown in FIG. 15A are only examples. The present invention is not of course limited to the above-mentioned configurations.

Figure 16:
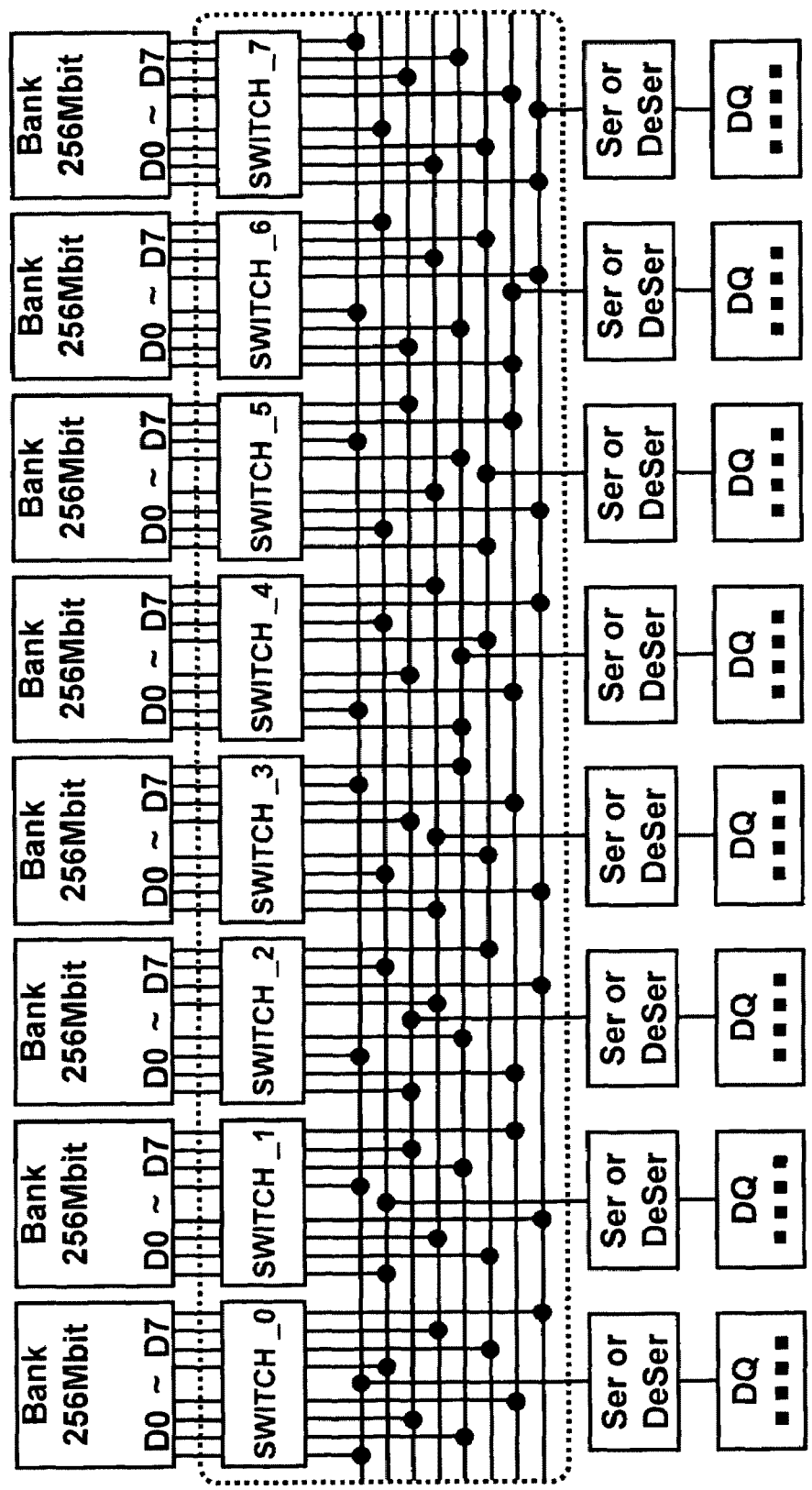
FIG. 16 is a diagram showing a selector portion in the embodiment of the present invention.

FIG. 16 is a diagram showing a circuit configuration including the eight banks of 256 Mbits, one or more selectors, serializers or deserializers, and DQ buffers in the configurations shown in FIGS. 7 through 14.

A selector portion is constituted from eight bidirectional selection switches.

Signals of 32 bits corresponding to the data D0 to D7 shown in FIG. 15A from each bank (BANK of 256 Mbits) are connected to a corresponding switch in each of the one or more selectors. Referring to FIG. 16, signal lines of four bits are collectively shown by one signal line (for each of the data D0 to D7).

Each of switches_0 to switches_7 in the one or more selectors is connected to a serializer or a deserializer (Ser or DeSer).

Figures 17A, 17B, 17C:
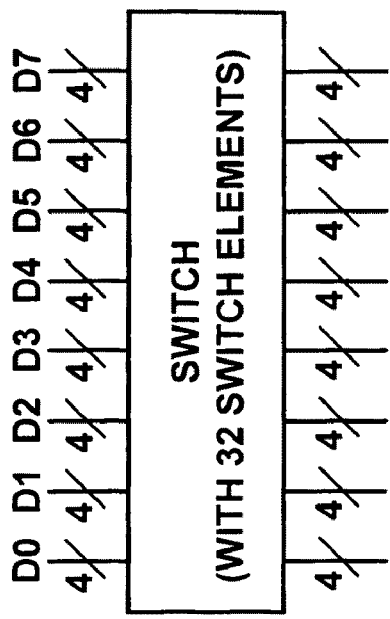
FIGS. 17A, 17B, and 17C are diagrams and a table showing a configuration of a switch circuit portion in the embodiment of the present invention.

FIGS. 17A, 17B, and 17C show a switch portion in FIG. 16. As shown in FIG. 17B, 32 input/output signal lines (for the data D0 to D7) are connected to each switch. 32 switch elements (refer to FIG. 17A) that control connections of those input/output signal lines are included in each switch.

As shown in FIG. 17A, each switch (SW) element is subject to on/off control according to three input signals A, B, and C. When the signals A, B, and C are High, an output of a NAND 201 goes LOW. Then, transistors 203 and 204 are turned on, and electrical conduction is attained between terminals X and Y. Otherwise, the output of the NAND 201 goes High, and the transistors 203 and 204 are turned off.

Lines for the signals A, B, and C are associated with the bank address (of the bits BA0, BA1, and BA2) or the VC address (of the bits CA0 CA1, and CA2).

FIG. 17C shows correspondence between each of the eight switches (switches_0 to switches_7 in FIG. 16) and each of the bank address (of the bits BA0, BA1, and BA2) or each of the VC address (of the bits CA0, CA1, CA2) by way of a table. Referring to FIG. 17C, a signal with a slash /a the head of a signal name, such as /BA0, indicates a negative logic signal of which input logic is inverted.

The bank address BA0 and the VC address CA0 are represented by substantially the same signal. According to the VC configuration, the name of the address (meaning represented by the name of the address) is properly used.

Figure 15:
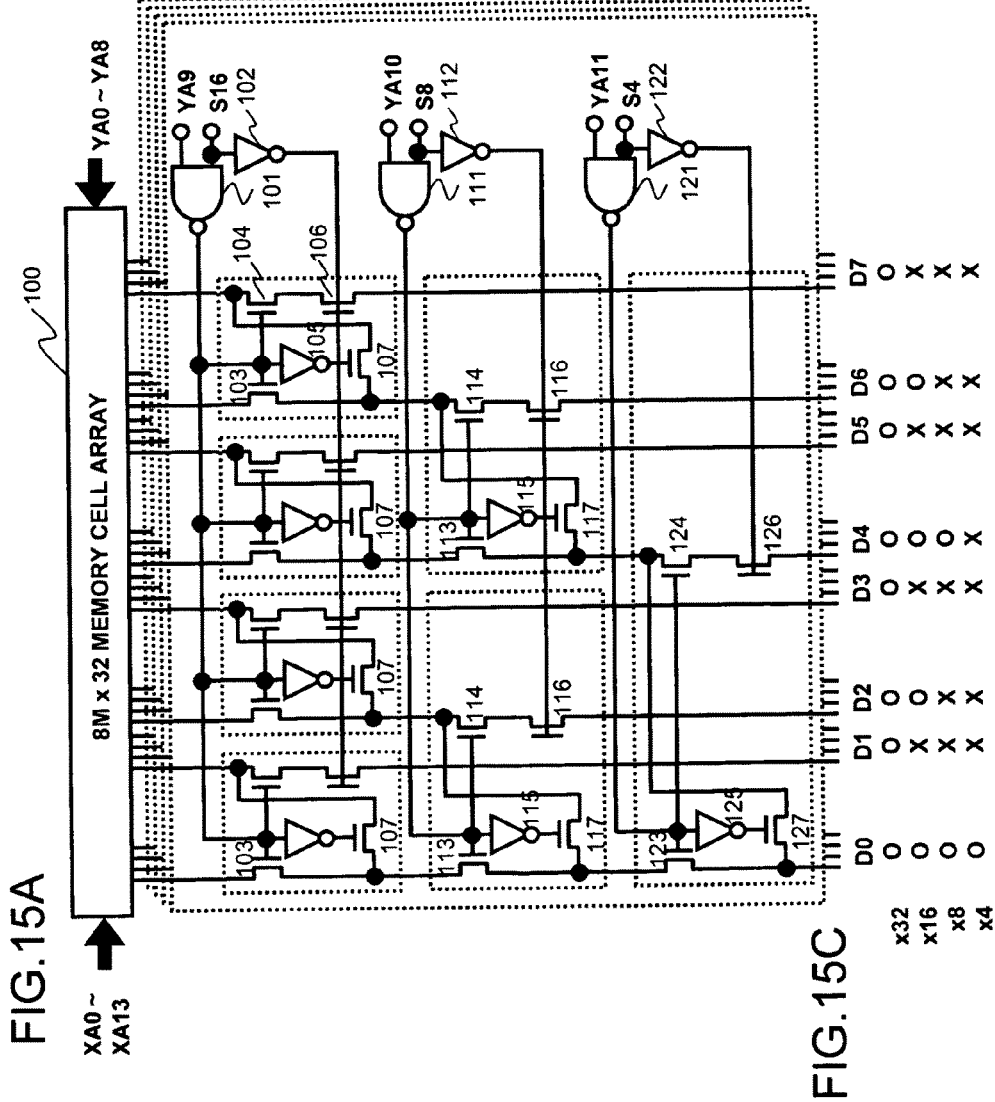
FIGS. 15A, 15B and 15C are a diagram and tables showing a configuration of one BANK (of 256 Mbits) in the embodiment of the present invention.

By combining the configurations in FIGS. 15 and 16 and the switches in FIG. 17, the circuit configuration including the banks, one or more selectors, serializers or deserializers, and DQ buffers is changed, corresponding to provision of the four product families.

FIG. 18 includes a diagram and a table for explaining an example of setting of a mode register 3 in the DDR3-SDRAM. By setting one to each of BA0 and BA1 in an address field, the internal mode register 3 is selected.

By setting 0 or 1 in A3 and A4, the mode register 3 is set, thereby allowing selection of one of the four product families (of the x32, x16, x8, and x4 configurations) shown in FIG. 18B.

Corresponding to a result of this selection, a High/Low level of each of the selection signals S16, S8, and S4 shown in FIG. 15 is set.

Figure 19:
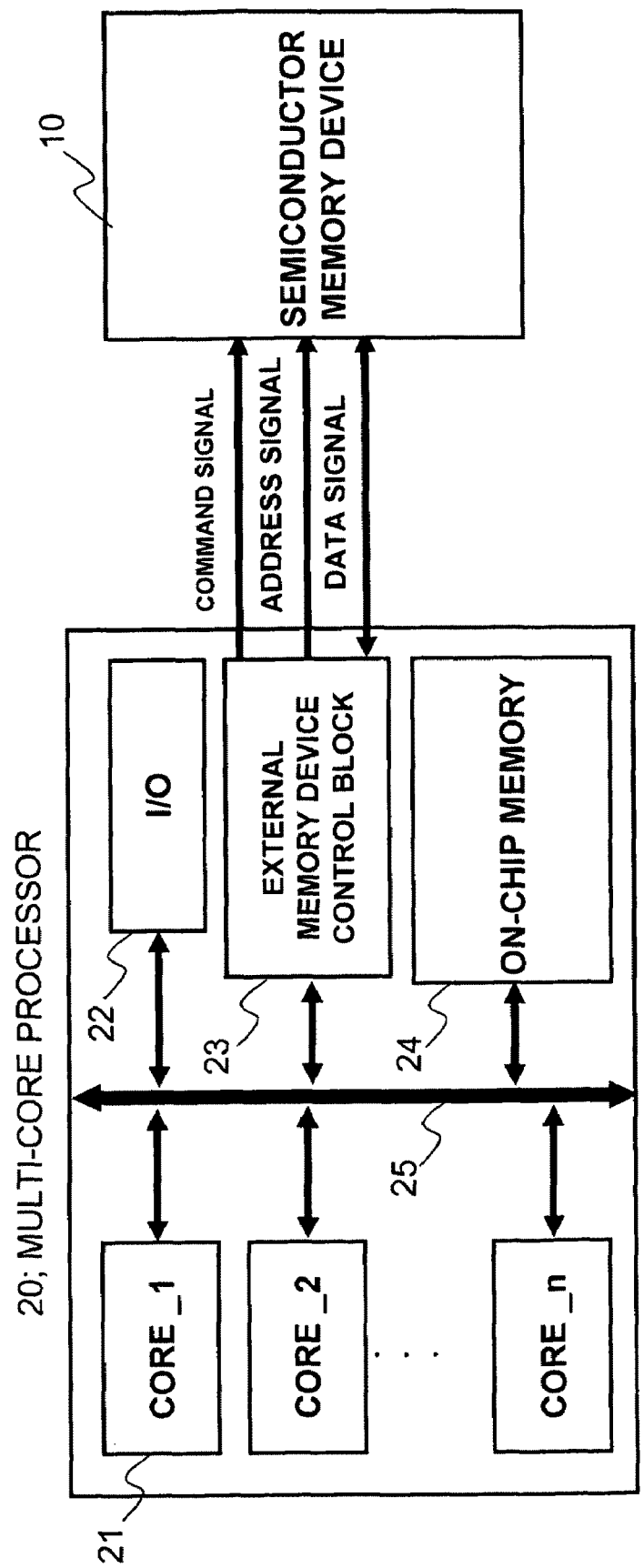
FIG. 19 is a diagram showing a configuration of a computer system that includes a multi-core processor in the embodiment of the present invention.
Figure 20:
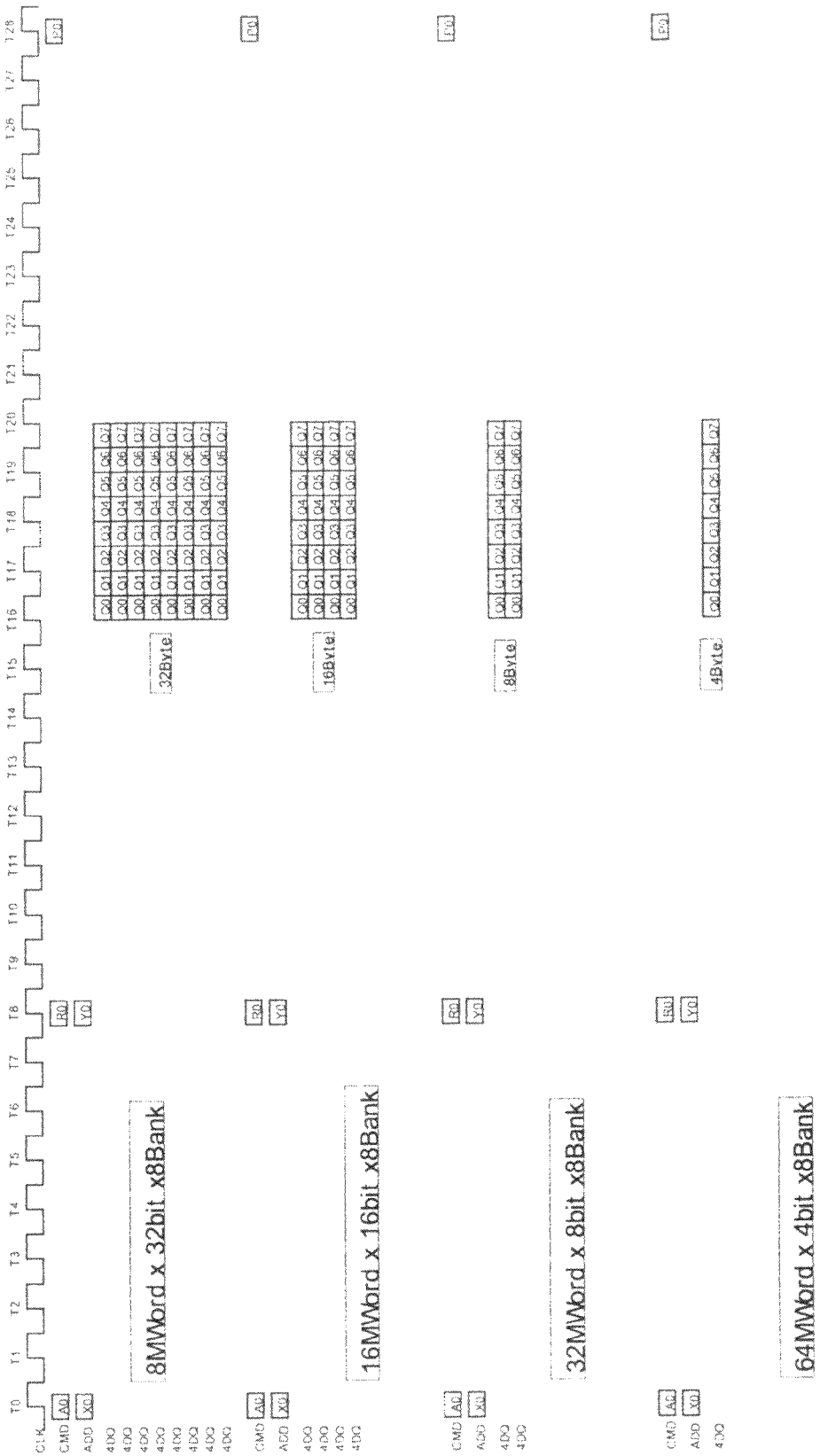
FIG. 20 is a timing diagram showing provision of bit configurations and (reading) operation waveforms in a typical DRAM
Figure 22:
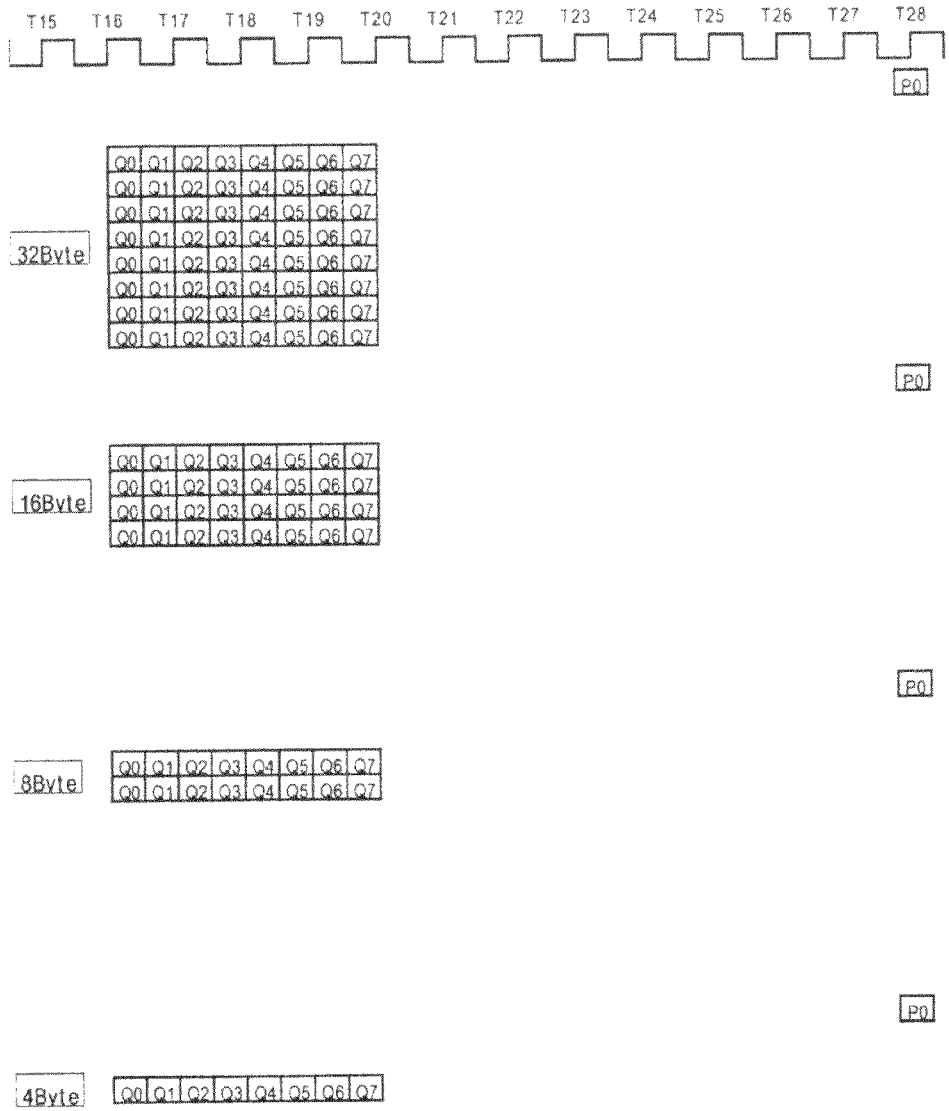
FIG. 22 is a partially expanded view showing a right half portion of FIG. 20.
Figure 23:
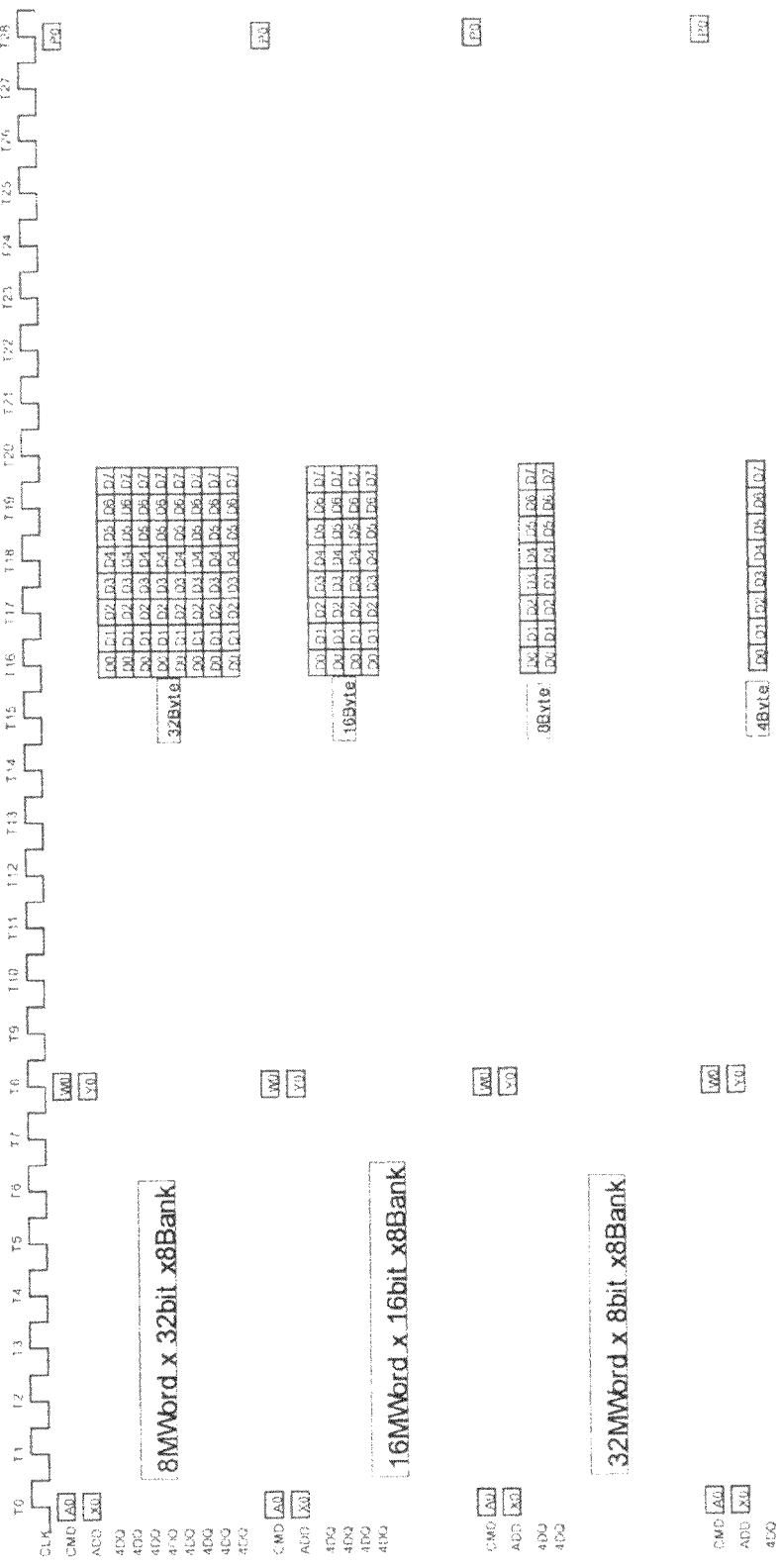
FIG. 23 is a timing diagram showing the provision of the bit configuration and (writing) operation waveforms in the typical DRAM.
Figure 24:
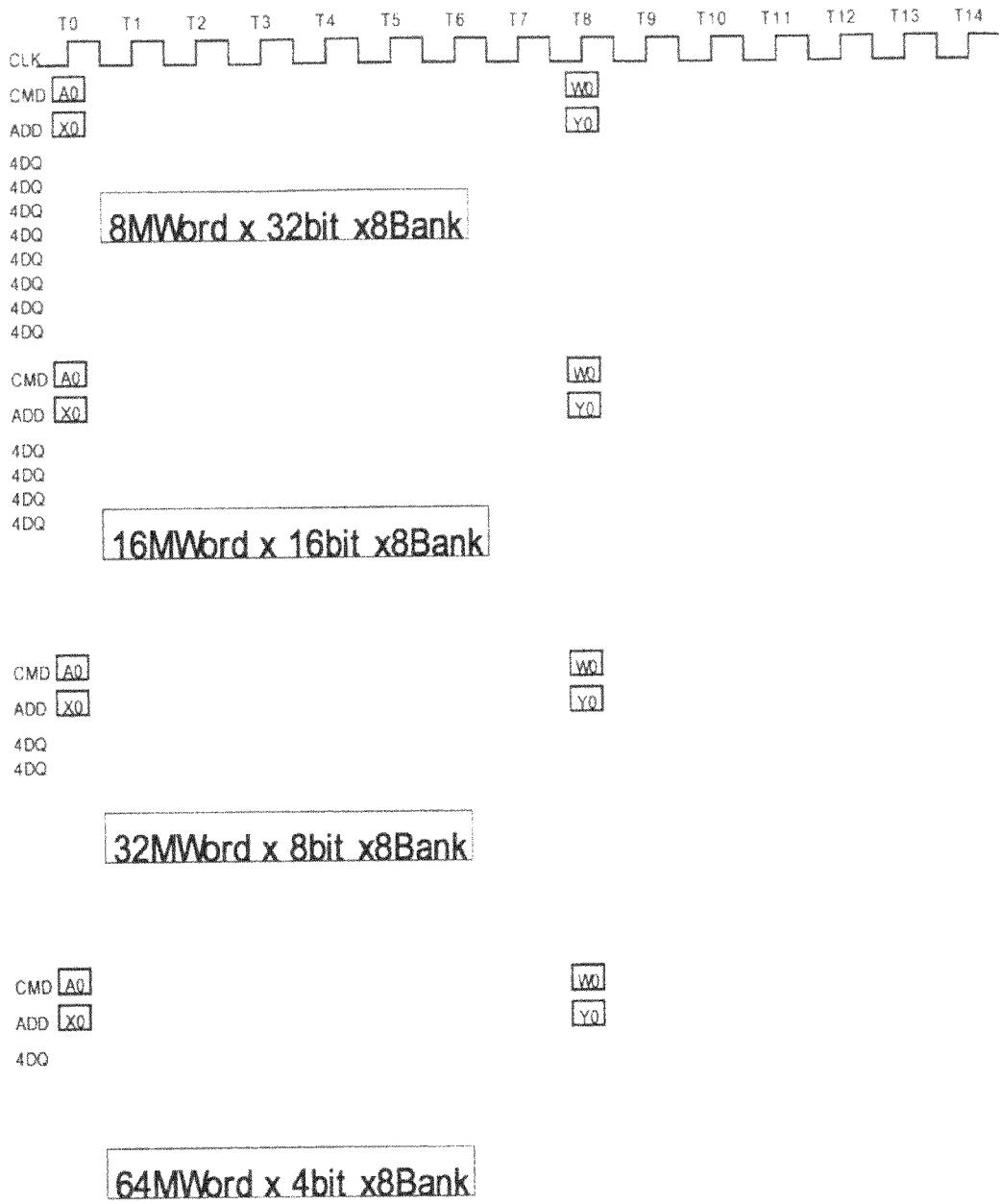
FIG. 24 is a partially expanded view showing a left half portion of FIG. 23.
Figure 25:
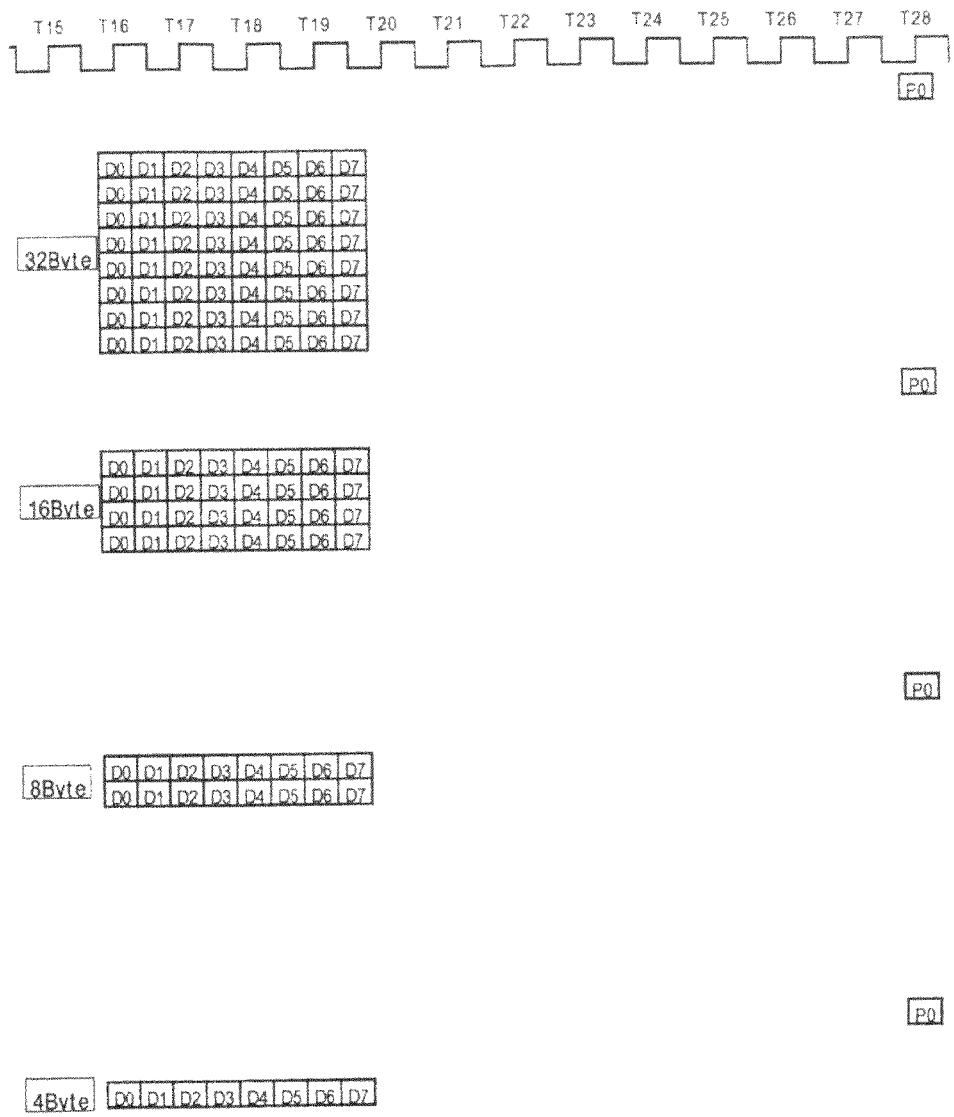
FIG. 25 is a partially expanded view showing a right half portion of FIG. 23.

FIG. 19 shows a configuration of a computer system including a semiconductor memory device (DRAM) 10 of the present invention described in connection with the embodiment, and a multi-core processor 20. The multi-core processor 20 includes core_through core_n (21), an I/O device 22, an external memory device control block 23, and an on-chip memory 24, which are connected by an internal bus 25.

When the processor includes four cores of core_1, core_2, core_3, and core_4 (which corresponds to a case where n=4 in core_n in FIG. 19), for example, a configuration of the semiconductor memory device (DRAM) 10 according to the present invention is set to the configuration of the four VCs (32M×8Bit×2Bank×4VC configuration).

Then, the external memory device control block included in the processor is designed so that the cores are associated with the four VCs, respectively.

With this arrangement, access from each core can be made to a corresponding VC irrespective of a memory access from other core. Then, as long as the address slots do not coincide with each other and the command slots do not coincide with each other, the accesses can also be made with data input and output signals overlapped.

Consequently, while setting a unit of data transfer (data amount to be exchanged in one access) to a comparatively small (optimal) size of eight bytes between each core and each VC, an overall rate of data transfer between the processor and the DRAM can be maintained at a value close to four times the data transfer unit between each core and each VC, which is the maximum data transfer rate value of this DRAM.

Further, even if the number of the cores in the processor to be used is changed at a time of manufacturing other apparatus, an optimal configuration can be obtained just by changing the mode register of the same DRAM. Accordingly, the need for holding an inventory of plural product families of the DRAMs in preparation for a change in a production volume ratio of plural apparatuses can be eliminated.

On the other hand, since a plurality of product families can be provided from a same chip, DRAM manufactures can reduce assortment of products, and can increase the manufacturing quantity of each product. Thus, DRAM cost can be reduced.

As described above, according to this embodiment, there is an effect that, for a multi-core type processor formed of a plurality of CPU cores each of which needs a small data transfer amount, a sufficiently large bandwidth can be provided with one or the needed smallest possible number of SDRAMs, thereby allowing achievement of cost reduction and improvement in performance of the system.

This embodiment can maintain the pin configuration that is the same as the common general-purpose SDRAM. Thus, it is not necessary to perform board design of the system or the like again. For this reason, the performance of the system can be improved at low cost.

According to this embodiment, a customer can perform product family provision by switching a mode register set value as necessary. Thus, the need for holding an unnecessary inventory can be eliminated.

According to this embodiment, manufacturers can also reduce an increase in the number of product families. Thus, there is an operation and effect that the management cost can be reduced.

The present invention can be extensively used for a memory of a common digital apparatus. The present invention can provide product family provision suitable for a system having a processor of a multi-core configuration in particular, in which a plurality of tasks is executed in parallel.

Modifications and adjustments of an exemplary embodiment and the embodiment are possible within the entire scope of disclosure (including claims) of the present invention, and further based on the basic technical concept of the invention. Various combinations and selections of various disclosed elements are possible within the scope of the claims of the present invention. That is, the present invention naturally includes various variations and modifications that could be made by those skilled in the art according to the entire disclosure including the claims and the technical concept.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor memory device comprising:
a plurality of banks each including a memory cell array including a plurality of memory cells;
a plurality of data signal terminals that receive and/or output data signals;
a plurality of control signal terminals that receive control signals; and
a plurality of address signal terminals that receive address signals,
wherein the plurality of banks are configurably grouped together from one to a plurality of virtual chips, each virtual chip including a predetermined number of the banks grouped together and being operable as one independent chip,
the plurality of data signal terminals being individually assigned to the one to the plurality of virtual chips, respectively, and the plurality of control signal terminals and the plurality of address signal terminals are shared among the plurality of virtual chips in a configuration of the plurality of virtual chips.

2. The semiconductor memory device according to claim 1, wherein a plurality of product families are produced from the same semiconductor memory device, in association with virtual chip configurations, and
wherein when a number of the virtual chips in one product family is n, where n is a predetermined integer equal to or greater than one, and a number of the data signal terminals belonging to each of the virtual chips is m, where m is a predetermined integer equal to or greater than one, the plurality of product families are made such that a product of n and m is of a constant value in each of the plurality of product families.

3. The semiconductor memory device according to claim 2, wherein both of the number n of the virtual chips and the number m of the data signal terminals belonging to one of the virtual chips are powers of two.

4. The semiconductor memory device according to claim 1, wherein the address signals received at the plurality of address signal terminals include:
a bank address signal that specifies each of the banks; and
a chip address signal that specifies each of the virtual chips, the bank address signal and the chip address signal being set such that a signal which serves as the bank address signal in one product family serves as the chip address signal in another product family.

5. The semiconductor memory device according to claim 1, wherein the control signals and the address signals for the plurality of the virtual chips are received respectively at the control signal terminals and at the address signal terminals by time division.

6. The semiconductor memory device according to claim 5, wherein the data signals are transferred from one of the data signal terminals in a manner in which a predetermined number of the data signals are consecutively input or output responsive to input of one predetermined command from the control signal terminals.

7. The semiconductor memory device according to claim 6, wherein periods, associated with different virtual chips, in which the predetermined number of the data signals are consecutively input or output, are partially overlapped in timings.

8. The semiconductor memory device according to claim 1, wherein each of the plurality of product families is made by at least one of:
writing a predetermined value to a product family setting register provided in the semiconductor memory device, by a predetermined method;
setting a bonding pad provided in the semiconductor storage device to a predetermined potential by bonding;
blowing a fuse element provided in the semiconductor memory device by a predetermined method;
connecting an anti-fuse element provided in the semiconductor memory device by a predetermined method; and
using one through a predetermined number of photomasks by switching, corresponding to the each of the product families in a fabrication process of the semiconductor memory device.

9. A computer system comprising:
a multi-core processor including:
a plurality of processor cores; and
a control block that controls data transfer between the processor cores and an external memory device; and
the semiconductor memory device as set forth in claim 1, the semiconductor memory device being controlled by the control block.

10. A method of providing product families of a semiconductor memory device, the method comprising:

in producing, from one product family configured to include one virtual chip with a maximum number of banks and a maximum number of data pins, another product family configured to have a plurality of virtual chips, each virtual chip being obtained by virtual division of a chip of the semiconductor memory device, each virtual chip including a predetermined number of banks grouped together and being operable as one independent chip, reducing a number of data pins assigned to each of the virtual chips such that the number of data pins will be less than that of the one product family and allocating data pins in a dedicated manner to the each of the virtual chips; and making the other product family such that a product of a number of the data pins allocated to each of the virtual chips and a number of the virtual chips is constant between the another product family and the one product family.

11. The method according to claim 10, wherein both of the number of the virtual chips and the number of the data pins allocated to the each of the virtual chips are powers of 2.

12. The method according to claim 10, wherein the each of the product families is made by at least one of:

writing a predetermined value to a product family setting register on a chip, by a predetermined method;

setting a bonding pad on the chip to a predetermined potential by bonding;

blowing a fuse element on the chip by a predetermined method;

connecting an anti-fuse element on the chip by a predetermined method; and using one through a predetermined number of photomasks by switching, corresponding to the each of the plurality of product families in a fabrication process of the chip.

13. The method according to claim 10, wherein pins that respectively receive a clock signal, a command signal, and an address signal are shared among the virtual chips, and the command signal and the address signal are supplied to each of the virtual chips by time division.

14. A semiconductor device comprising:

a plurality of banks each including a memory cell array including a plurality of memory cells; and a plurality of data pins that receive or output data signals, the plurality of data pins being assigned in a dedicated manner to each of one to a plurality of virtual chips, each virtual chip being obtained by virtual division of one chip of the semiconductor device, each virtual chip including a plurality of the banks grouped together and being operable as one independent chip, wherein in a configuration of the plurality of virtual chips, pins that receive command signals and address signals are shared among the plurality of virtual chips, and the command signals and the address signals are supplied to each of the plurality of virtual chips by time division.

15. The semiconductor device according to claim 14, wherein in a product family where a number of the banks is half a number of the banks in a virtual chip of one product family, a number of the virtual chips is set to double a number of the virtual chips in the one product family, and wherein each of the virtual chips that are twice as many as the virtual chips in the one product family, a number of dedicated data pins assigned in correspondence with the each of the virtual chips is set to a half of a number of dedicated data pins in the one product family.

16. The semiconductor device according to claim 14, wherein each of the one to the plurality of virtual chips comprises:

one or a plurality of the banks each of which receives a bank address, a row address, and a column address, and wherein the configuration of the plurality of virtual chips, each of the plurality of virtual chips comprises:

a selector which receives the bank address and also a chip address that selects one of the plurality of virtual chips; and serial-to-parallel and parallel-to-serial conversion circuits that receive parallel data of a predetermined bit width from the selector, converts the parallel data to serial data for output to the data pins, and converts serial data from the data pins to parallel data of the predetermined bit width and supplies the converted parallel data to the selector.

17. The semiconductor device according to claim 16, wherein a configuration of each of the plurality of banks is able to be changed in accordance with the product family, and wherein the product family where a number of the data pins in each virtual chip is set to a fraction of $2^n$, where n is a predetermined non-negative integer, of the data pins in the product family having a maximum number of the data pins in the virtual chip, the each of the plurality of banks connects data input/output lines in the product family having the maximum number of the banks in the virtual chip to corresponding ones of the selectors at intervals of the fraction of $2^n$ of intervals of the product family having the maximum number of the banks in the virtual chip, based on a product family selection signal supplied thereto and consecutive n bits column address located higher to a highest-order column address of the product family having the maximum number of the data pins in the virtual chip.

18. The semiconductor memory device according to claim 1, wherein each of the one to the plurality of virtual chips is configured for assignment in a dedicated one to one basis with the plurality of data signal terminals.

19. The semiconductor memory device according to claim 1, wherein the one independent chip comprises a physical chip that is configurable to be virtually grouped from the one to the plurality of virtual chips.

20. The semiconductor memory device according to claim 1, wherein each core from a multi-core processor is configured to correspond with at least one of the plurality of virtual chips irrespective of a memory access from another core of the multi-core processor.

* * * * *